United States Patent [19]

Nakagawa et al.

[11] Patent Number: 5,124,773
[45] Date of Patent: Jun. 23, 1992

[54] CONDUCTIVITY-MODULATION METAL OXIDE SEMICONDUCTOR FIELD EFFECT TRANSISTOR

[75] Inventors: Akio Nakagawa, Hiratsuka; Yoshihiro Yamaguchi, Urawa; Kiminori Watanabe, Kawasaki, all of Japan

[73] Assignee: Kabushiki Kaisha Toshiba, Kawasaki, Japan

[21] Appl. No.: 563,720

[22] Filed: Aug. 7, 1990

Related U.S. Application Data

[63] Continuation of Ser. No. 160,277, Feb. 25, 1988, Pat. No. 4,980,743.

[51] Int. Cl.$^5$ ............................................. H01L 29/00
[52] U.S. Cl. ......................................... 357/37; 357/86; 357/20; 357/39; 357/38
[58] Field of Search ................ 357/20, 23.4, 38, 40, 357/39, 86, 43, 37, 38 G, 38 T, 58

[56] References Cited

U.S. PATENT DOCUMENTS 4,811,072  3/1989  Risberg ........................... 357/86 X
4,912,541  3/1990  Baliga et al. ..................... 357/43 X Primary Examiner—William Mintel
Assistant Examiner—Roy Potter
Attorney, Agent, or Firm—Oblon, Spivak, McClelland, Maier & Neustadt

[57] ABSTRACT

A conductivity-modulation MOSFET employs a substrate of an N type conductivity as its N base. A first source layer of a heavily-doped N type conductivity is formed in a P base layer formed in the N base. A source electrode electrically conducts the P base and the source. A first gate electrode insulatively covers a channel region defined by the N+ source layer in the P base. A P drain layer is formed on an opposite substrate surface. An N+ second source layer is formed in a P type drain layer by diffusion to define a second channel region. A second gate electrode insulatively covers the second channel region, thus providing a voltage-controlled turn-off controlling transistor. A drain electrode of the MOSFET conducts the P type drain and second source. When the turn-off controlling transistor is rendered conductive to turn off the MOSFET a "shorted anode structure" is temporarily formed wherein the N type base is short-circuited to the drain electrode, whereby case, the flow of carriers accumulated in the N type base into the drain electrode is facilitated to accelerate dispersion of carriers upon turn-off of the transistor.

18 Claims, 21 Drawing Sheets

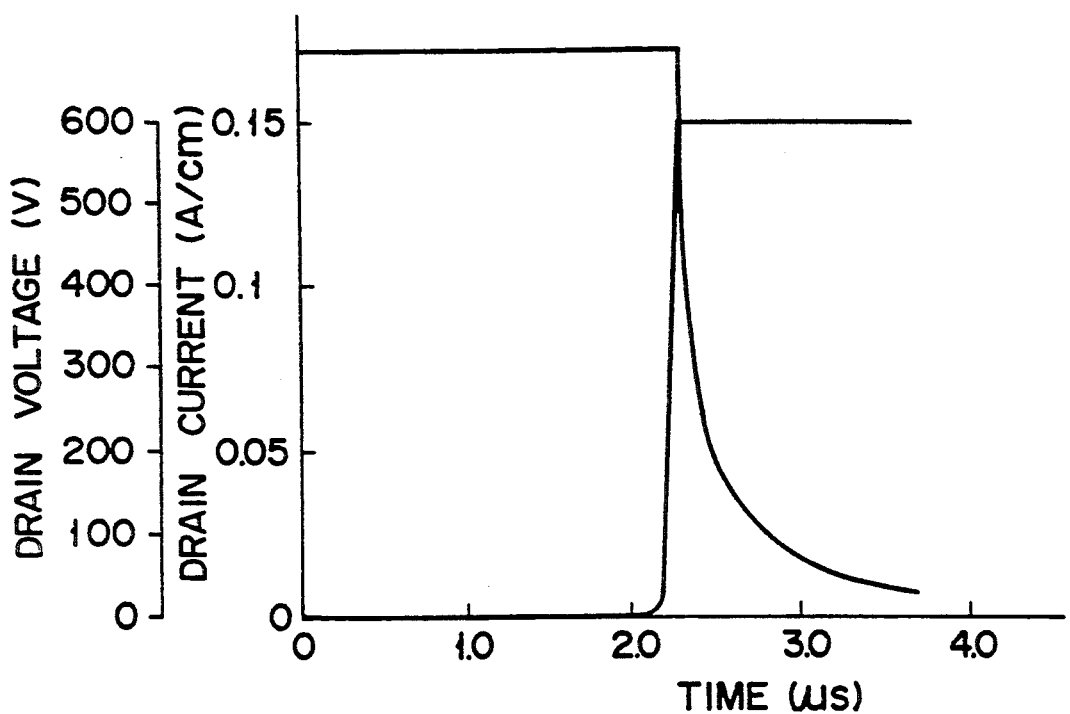
F I G. 3
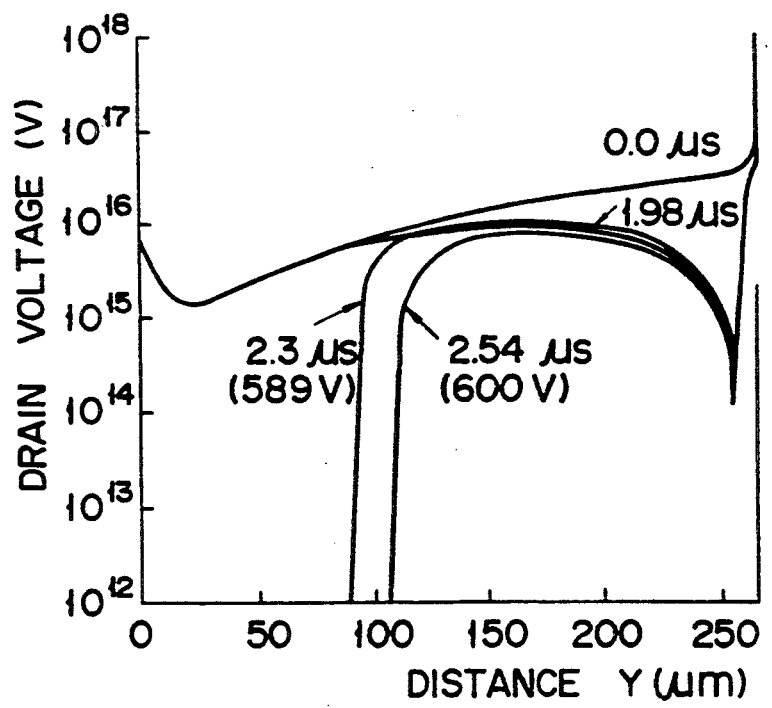
F I G. 4

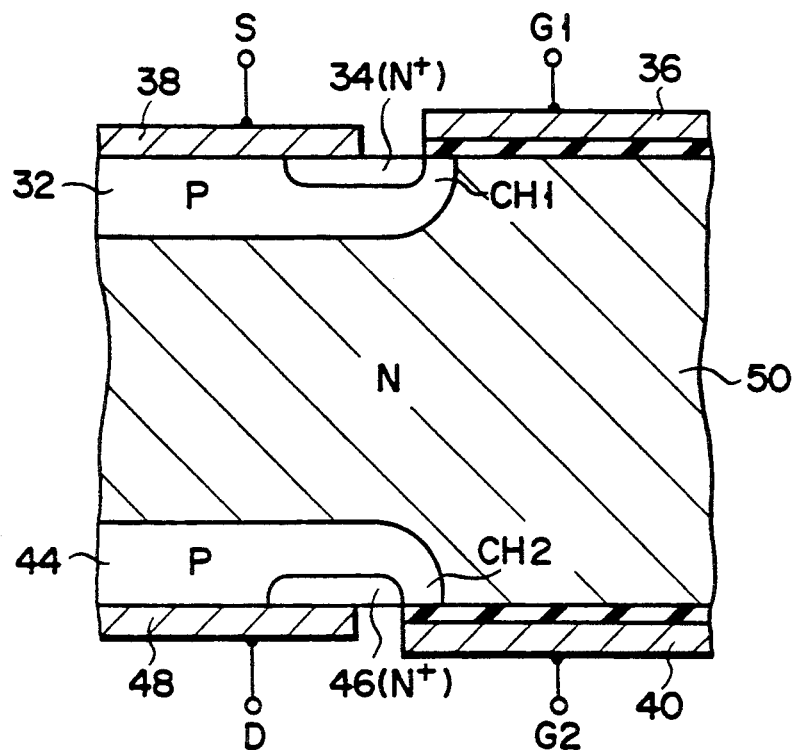
F I G. 5
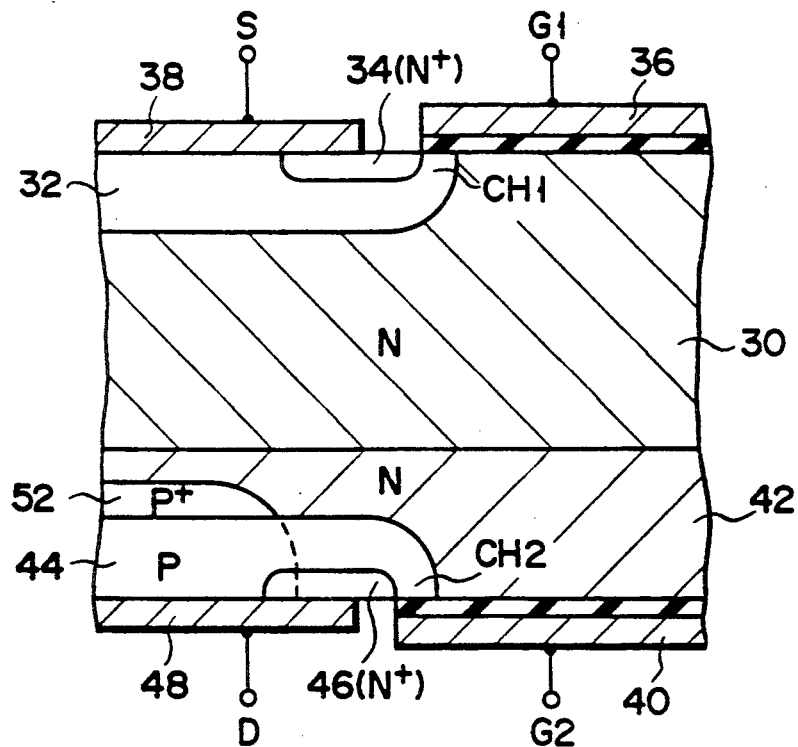
F I G. 6

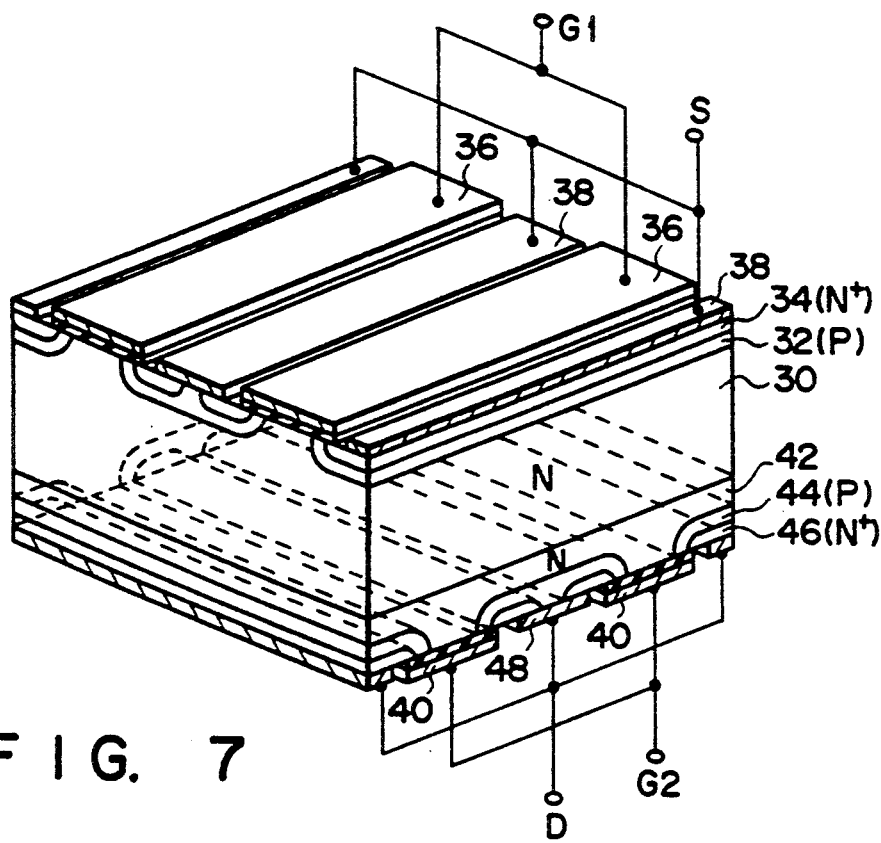
F I G. 7
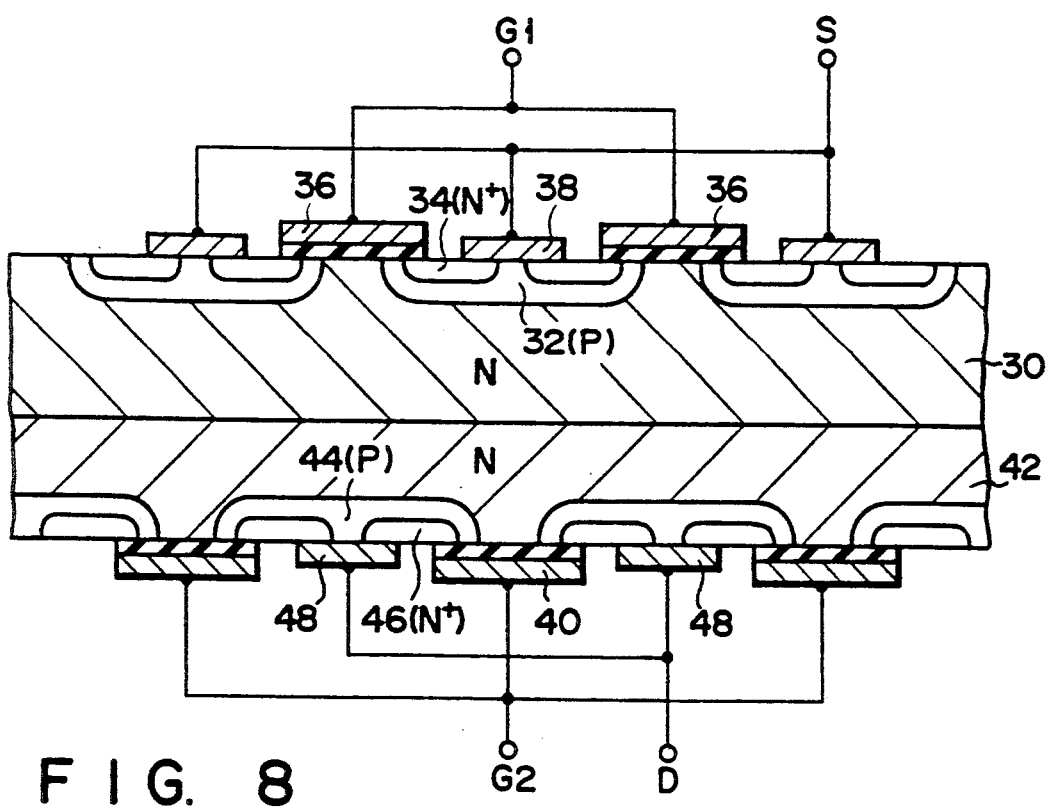
F I G. 8

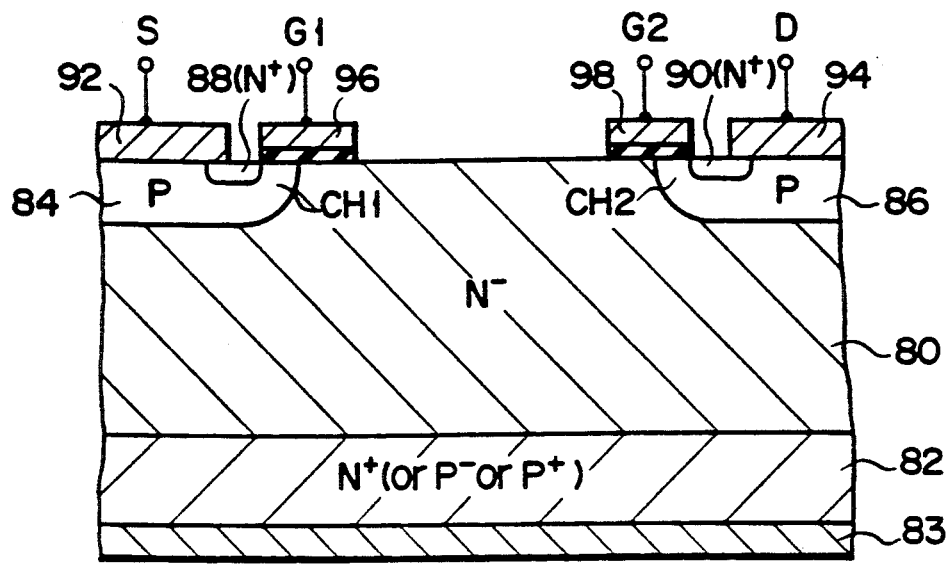
F I G. 12
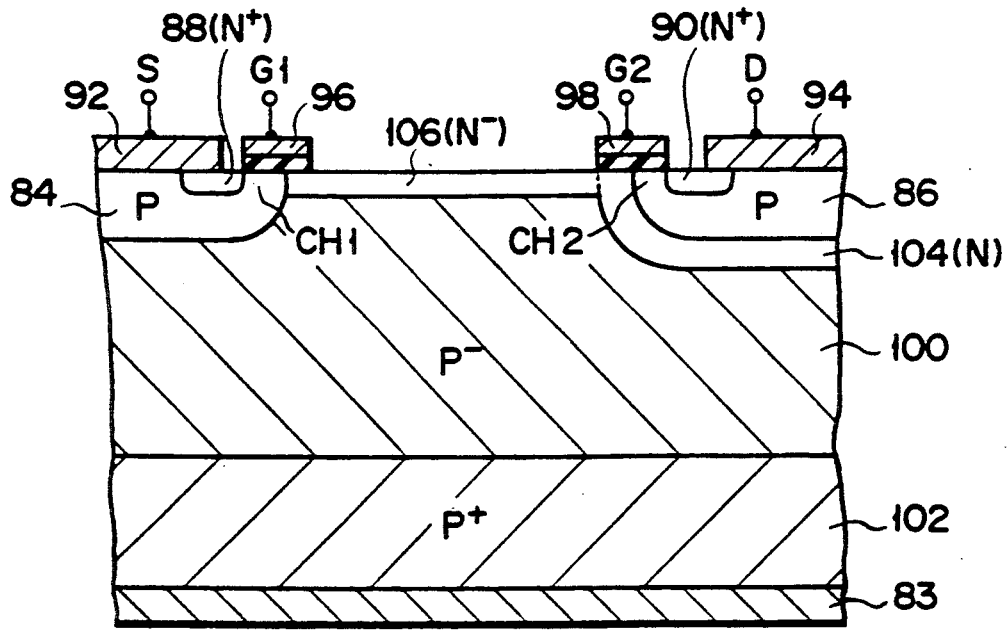
F I G. 13

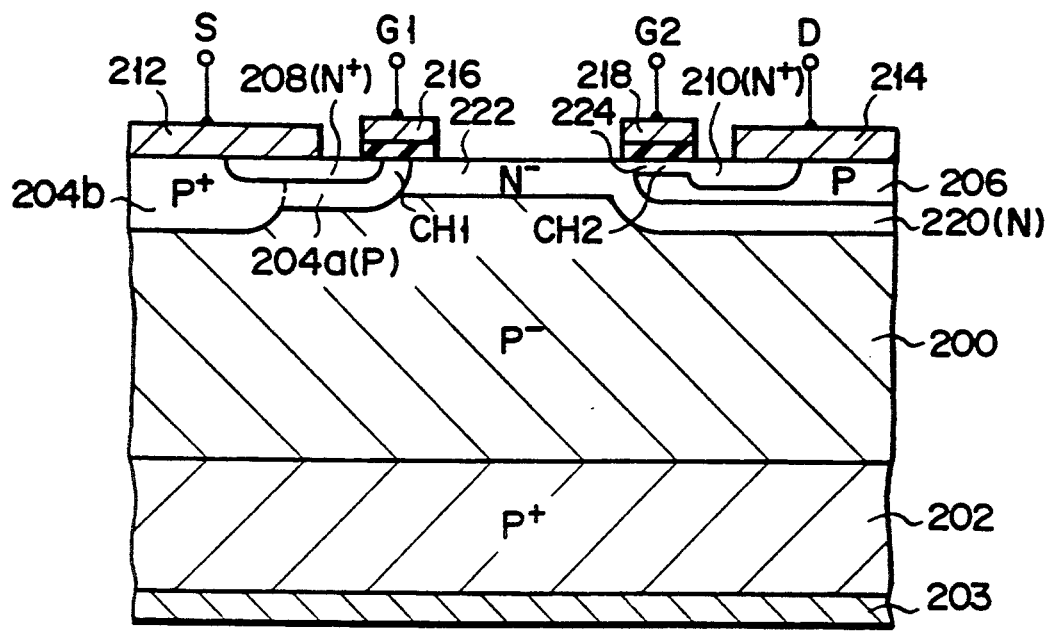
F I G. 22
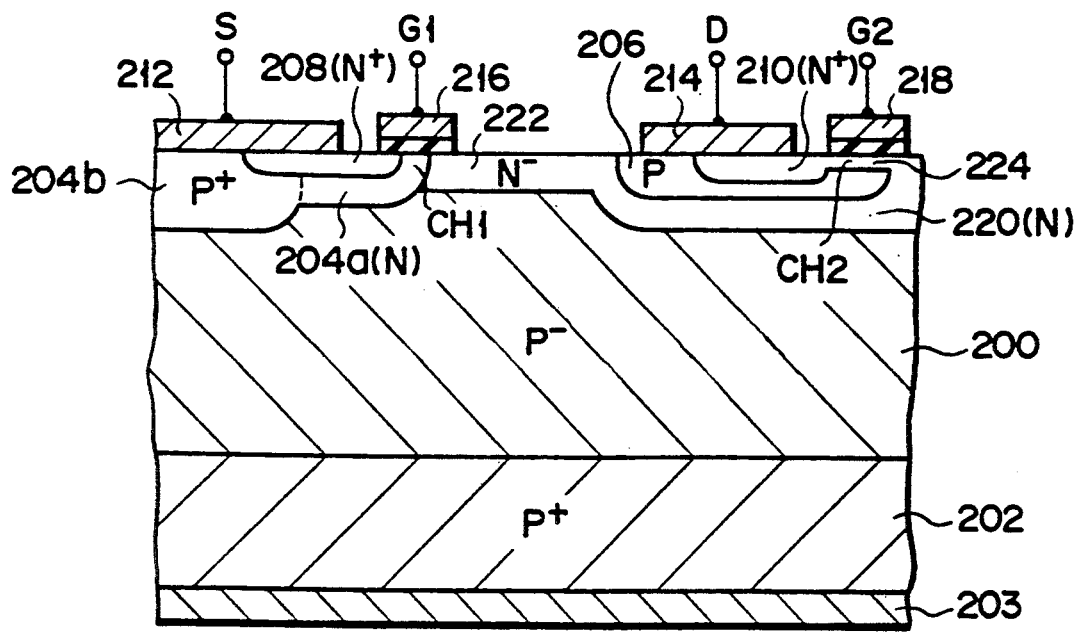
F I G. 23

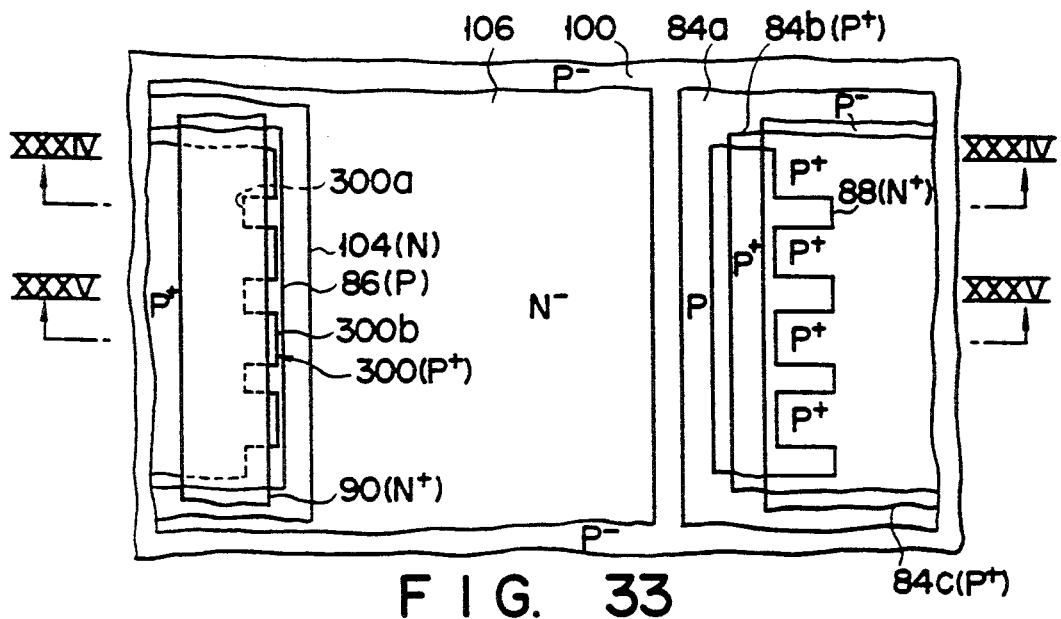
F I G. 33
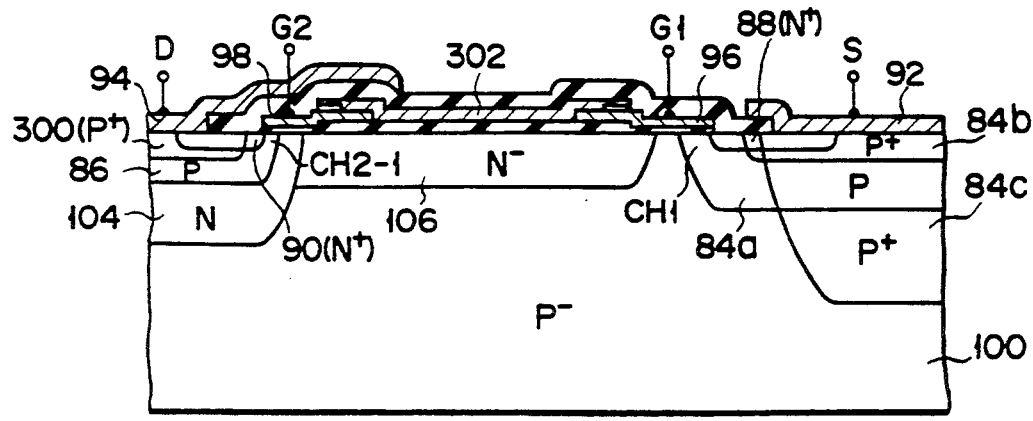
F I G. 34
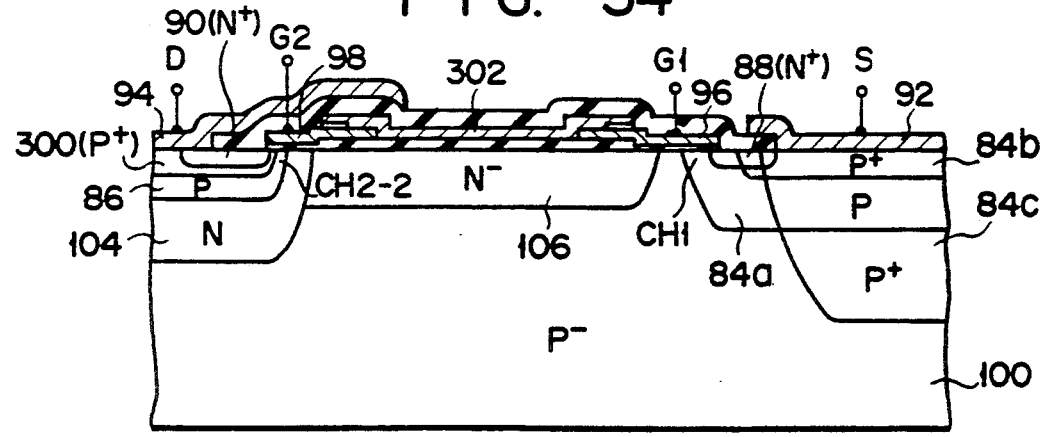
F I G. 35

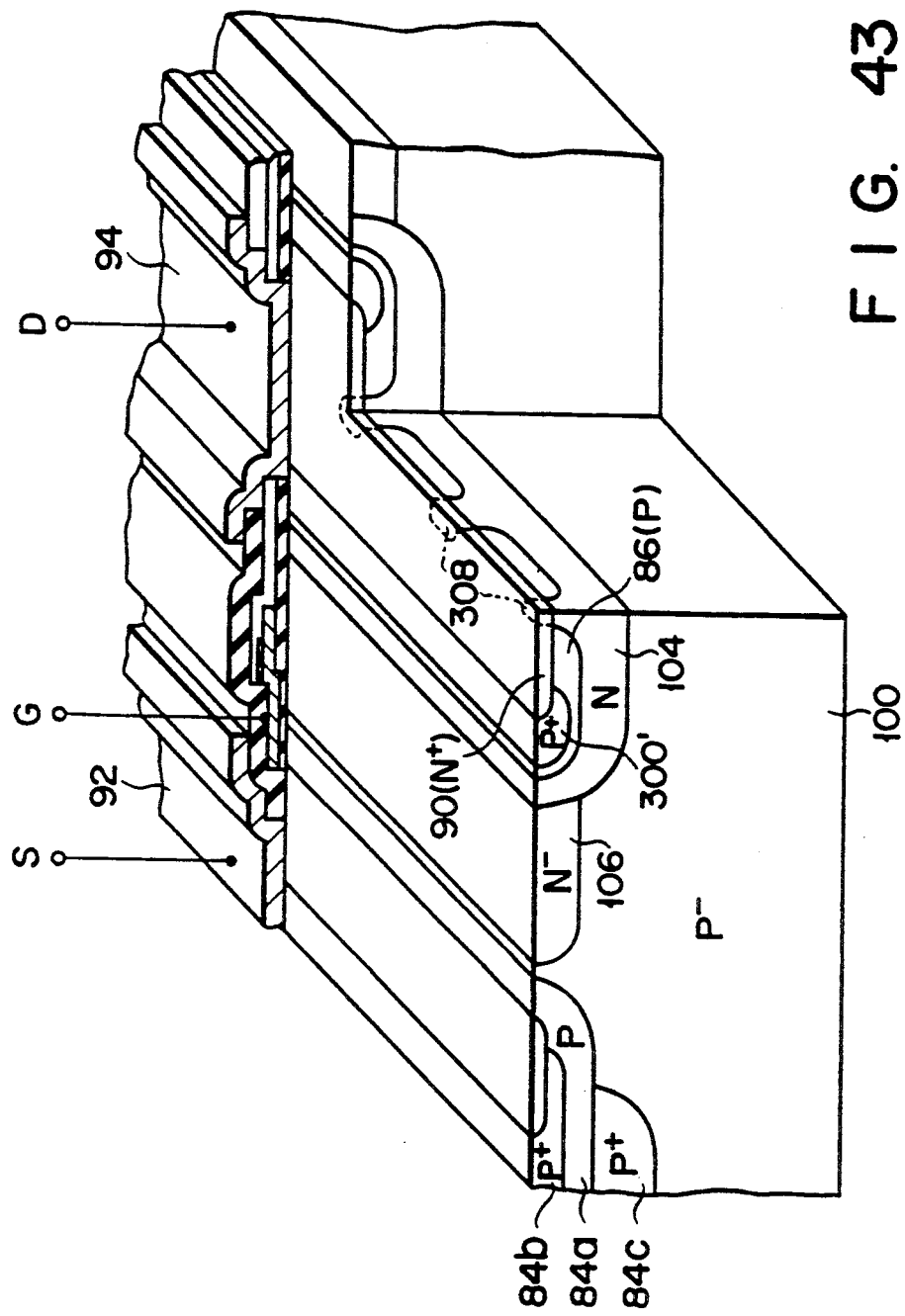
F I G. 43

CONDUCTIVITY-MODULATION METAL OXIDE SEMICONDUCTOR FIELD EFFECT TRANSISTOR

This is a continuation of application Ser. No. 07/160,277, filed on Feb. 25, 1988, now U.S. Pat. No. 4,980,743.

BACKGROUND OF THE INVENTION

1. Field of the Invention

The present invention relates to metal insulator semiconductor field effect transistors and, more particularly, to an improvement of a conductivity-modulation MOSFET.

2. Description of the related art

A conductivity-modulation MOSFET has a semiconductive drain layer, an N type conductivity base layer (N base layer) formed on a buffer layer, and a base layer (P base layer) of P type conductivity. The P base layer is formed by diffusion in an N type semi-conductive layer serving as the N base layer. A heavily-doped N type layer (N+ layer) is formed on the P base layer to define a channel region of the MOSFET. A gate electrode layer insulatively covers the N base layer and the channel region, and a source electrode layer electrically shorts the P base layer and the M+ source layer. When a positive voltage is applied to the gate electrode, the channel region is inverted, so that carriers (electrons) are injected from the N+ source layer into the N base layer. When the electrons enter the drain layer through the buffer layer, the PN junction of the MOSFET is forward-biased, and as a result, the MOSFET is turned on. When a zero or negative voltage is applied to the gate electrode, the inverted layer in the channel region disappears, and hence, the channel disappears. As a result, the MOSFET is turned off.

In order to improve a turn-off switching speed of such a conductivity-modulation MOSFET, carriers accumulated in the N base layer thereof must disappear faster. However, with a conventional conductivity-modulation MOSFET, if the carrier lifetime in the N base layer is shortened in order to improve the turn-off speed, a voltage in the device becomes undesirably high, which leads to the difficulty in turn-on drive of the MOSFET.

SUMMARY OF THE INVENTION

It is therefore an object of the present invention to provide an improved conductivity-modulation metal insulator semiconductor field effect transistor.

It is another object of the present invention to provide a new and improved conductivity-modulation metal insulator semiconductor field effect transistor which can increase a turn-off switching speed while a turn-on voltage thereof is kept lowered.

In accordance with the above objects, the present invention is addressed to a specific semiconductor device, which has a conductivity-modulation unipolar transistor formed on a semiconductive substrate. The transistor has first and second base layers, a source layer formed in the second base layer, a source electrode layer for electrically conducting the second base layer and the source layer, a drain layer, a drain electrode layer formed on the drain layer, and a gate electrode layer insulatively provided on the substrate. A carrier discharge means is also provided, in the semiconductor device, for, when the conductivity-modulation unipolar transistor is turned off, enhancing an electrical connection property between the first base layer and the drain electrode, and facilitating injection of carriers accumulated in the first base layer into the drain electrode, so that the removal of carriers is accelerated in the conductivity-modulation unipolar transistor.

The carrier discharge means may include a voltage-controlled switching transistor (MOSFET) having a second gate electrode, which is rendered conductive when the conductivity-modulation transistor is turned off, so that a first base layer is electrically shorted with a drain electrode, thereby temporarily forming a shorted anode structure therein. When the conductivity-modulation transistor is turned on, the voltage-controlled switching transistor is rendered nonconductive, so that the first base layer is electrically disconnected from the drain electrode. Alternatively, the carrier discharge means may be obtained by constantly half-shorting the first base layer with the drain electrode. In this case, an impurity having the same conductivity type as that of the first base layer is doped, thus forming a lightly-doped bypass layer for half-conducting the first base layer to the drain electrode upon turn-on and turn-off the conductivity-modulation transistor.

The present invention and its objects and advantages will become more apparent from the detailed description of a preferred embodiment presented below.

BRIEF DESCRIPTION OF THE DRAWINGS

In the detailed description of a preferred embodiment of the invention presented below, reference is made to the accompanying drawings of which:

FIG. 3 is a graph showing changes in drain voltage and drain current upon turn-off of the MOSFET;

FIG. 4 is a graph showing measurement results a change over time in electron density distribution with respect to various drain voltage applications upon turn-off of the MOSFET, wherein "Y" plotted along the abscissa represents a distance from the center of a turn-on controlling gate electrode;

FIGS. 5 and 6 are diagrams showing sectional structures of main parts of conductivity-modulation MOSFETs having vertical double-gate structures according to other embodiments of the present invention;

FIG. 7 is a diagram showing a perspective view of a main part of a conductivity-modulation MOSFET having a vertical double-gate structure according to still another embodiment of the present invention;

FIGS. 8 to 11 are diagrams showing sectional structures of main parts cf conductivity-modulation MOSFETs having vertical double-gate structures according to still other embodiments of the present invention;

FIGS. 12 and 13 are diagrams showing sectional structures of main parts of conductivity-modulation MOSFETs having horizontal double-gate structures according to still other preferred embodiments of the present invention;

FIGS. 22 to 25 are diagrams showing sectional structures of main parts of conductivity-modulation MOSFETs having horizontal double-gate structures according to still other embodiments of the present invention;

FIG. 33 is a diagram showing a two-dimensional structure of a main part of another conductivity-modulation MOSFET for embodying the present invention;

FIGS. 34 and 35 are diagrams taken along different cutting lines of the device shown in FIG. 33;

FIG. 43 is a perspective view showing a main part structure of a conductivity-modulation MOSFET according to still another embodiment of the present invention; and

DETAILED DESCRIPTION OF THE PREFERRED EMBODIMENTS

Figure 1:
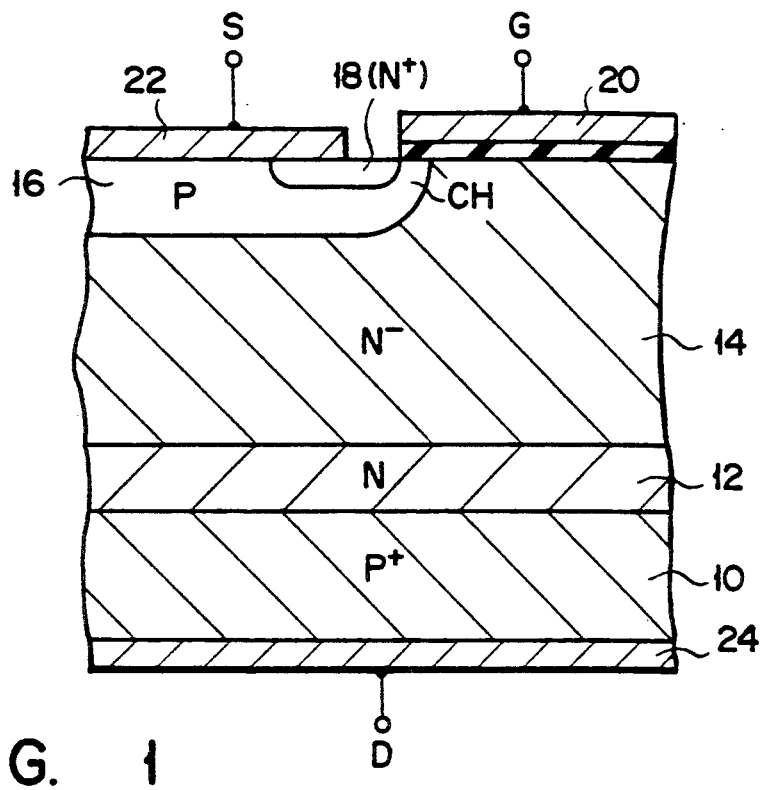
FIG. 1 is a diagram showing a sectional structure of a main part of a conventional conductivity-modulation MOSFET.

Prior to description of embodiments of the present invention, a conductivity-modulation MOSFET (also called a "bipolar mode MOSFET") having a conventional vertical structure will be described with reference to FIG. 1, for the sake of easy understanding of the present invention. In FIG. 1, heavily-doped P type conductivity (P+type) semiconductor layer 10 serves as a drain layer. N type buffer layer 12 and N−type base layer 14 are formed on drain layer 10. P type base layer 16 is formed in N−base layer 14 by diffusion. N+type layer 18 serving as a source of the MOSFET is formed in P base layer 16, and defines, as channel region CH of the FET, a portion of P base layer 16 located between itself and N base layer 14. Gate electrode layer 20 insulatively covers N−base layer 14 and channel CH. Source electrode layer 22 is disposed on layer 14 so as to electrically short between P base layer 16 and N+source layer 18. Drain electrode layer 24 is disposed on an opposite surface of P+drain 10.

When gate electrode 20 is positively biased with respect to source electrode 22, the MOSFET is turned on. The physical mechanism of the MOSFET is as follows. When gate electrode 20 is applied with a positive voltage, channel region CH is inverted and electrons are injected from source 18 into N−base 14 through channel CH. When these electrons enter P+drain 10 through N buffer layer 12, the PN junction of the MOSFET is forward-biased. In this case, holes are injected from P+drain 10 to N base 14 through N buffer 12. Therefore, both the electrons and holes are stored or accumulated in N−base 14, thus inducing conductivity modulation. Even when the resistance of N−base 14 is set to be relatively high in order to obtain high withstand voltage characteristics, the resistance of N−base 14 is decreased upon turn-on of the MOSFET due to the conductivity modulation, so that a turn-on voltage is decreased. When gate electrode 20 is biased to zero or negative with respect to source electrode 22, the inverted layer formed in channel region CH disappears, and the MOSFET is turned off.

According to the conventional conductivity-modulation MOSFET, in order to increase a turn-off speed, carriers accumulated in N−base 14 must be disappeared as fast as possible. Unless electrons accumulated in N−base 14 are rapidly moved into drain 10, a PNP transistor constituted by P+drain 10, N buffer 12, N−base 14, and P base 16 is operated, and a large tail current flows through the MOSFET. In order to achieve rapid disappearance of accumulated carriers in N−base 14, a carrier lifetime can be decreased. However, in this case, a voltage (turn-on voltage) necessary for turning on the MOSFET is undesirably increased to cause its turn-on characteristics to be degraded. In the conventional MOSFET, improvement of the turn-off speed (switching-off speed) and a decrease in turn-on voltage cannot be simultaneously realized.

The aforementioned conflicting problems in the conventional conductivity-modulation MOSFET can be effectively eliminated by a conductivity-modulation MOSFET according to the present invention presented below.

Figure 2:
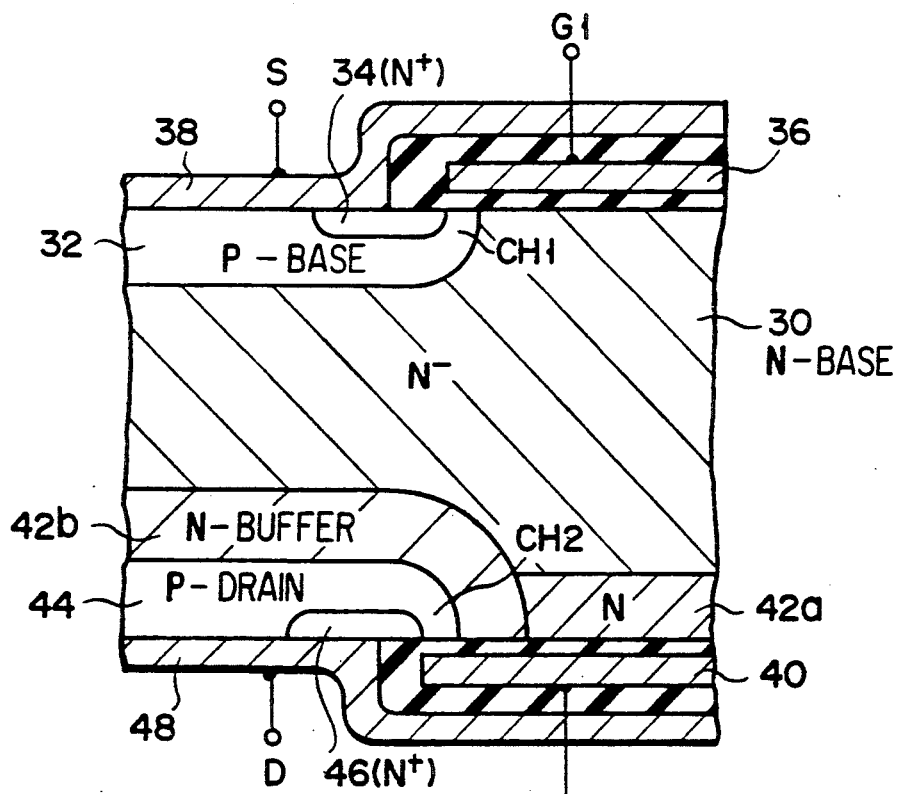
FIG. 2 is a diagram showing a sectional structure of a main part of a conductivity-modulation MOSFET having a vertical double-gate structure according to a preferred embodiment of the present invention.

Referring to FIG. 2, a vertical conductivity-modulation MOSFET having a double-gate structure has a characteristic feature in that it has second gate electrode G2 as a turn-off controlling electrode. More specifically, P base layer 32 and N+type source layer 34 are formed in N−diffusion layer 30 in the same manner as in the prior art shown in FIG. 30. N+source layer 34 defines, as first channel region CH1, a portion of P base 32 located between itself and N−base 30. Polysilicon layer 36 serving as first gate electrode G1 is insulatively provided above N−base layer 30 to be self-aligned with N+source 34. Metal layer 38 serving as a source electrode electrically shorts P base layer 32 and N+source layer 34. N buffer layer 42 comprises N layers 42a and 42b (if N buffer layer 42 is separately formed as layers 42a and 42b, as illustrated in FIG. 2, this structure allows effective threshold value control of channel CH2). Polysilicon layer 40 serving as a second gate electrode is insulatively provided above one surface of N buffer layer 42. The other surface of N buffer layer 42 is connected to N−base layer 30. N buffer layer 42 serves to prevent generation of a punch-through phenomenon, and to increase a MOSFET withstand voltage. P type drain layer 44 is formed in N buffer layer 42. N+type source diffusion layer 46 is formed in P type drain layer 44 by diffusion. N+layer 46 defines, as second channel region CH2, a portion of P source 44 located between itself and N buffer 42. Metal layer 48 serving as a drain electrode electrically shorts between layers 44 and 46. As shown in FIG. 2, N+layer 46, P drain 44, and N buffer 42 are formed by diffusion to be self-aligned with an end portion of second gate electrode 40. In the following description, first gate electrode G1 is referred to as a "turn-on controlling gate electrode" or simply as an "ON gate" of the MOSFET hereinafter, and second gate electrode G2 is referred to as a "turn-off controlling gate electrode" or simply as an "OFF gate" hereinafter.

The conductivity-modulation MOSFET is turned on, when turn-on controlling gate electrode G1 is positively biased with respect to source electrode S, and turn-off controlling gate electrode G2 is biased to a zero or negative potential with respect to drain electrode D. The physical mechanism associated with the turn-on of the MOSFET is substantially the same as that in the prior art shown in FIG. 1. More specifically, in a turn-on mode of the MOSFET, OFF gate G2 is biased to a zero or negative potential. Therefore, second channel region CH2 is kept nonconductive. N−buffer 30 is disconnected from drain electrode D in the same manner as in N buffer 12 shown in FIG. 1. In this state, when ON gate G1 is positively biased, first channel region CH1 is inverted, and as a result, electrons are injected from N+source 34 into N−base 30. When these electrons migrate toward the drain layer through N buffer 30, holes are injected from P drain diffusion layer 44 into N−base 30 through N buffer 42. The MOSFET is thus turned on. The turn-on operation is the same as that of the conventional MOSFET shown in FIG. 1, and conductivity modulation is performed in N base layer 30.

When the MOSFET is to be turned off, turn-on controlling gate electrode G1 is biased to a zero or negative potential with respect to source electrode S, and turn-off controlling gate electrode G2 is positively biased with respect to drain electrode D. Thus, channel region CH1 is rendered nonconductive, and channel region CH2 is inverted and rendered conductive. Since channel region CH1 is rendered nonconductive, injection of electrons from N+source 34 into N base 30 is inhibited. On the other hand, since channel region CH2 is rendered conductive, N+source 46 is electrically conducted to N buffer 42, so that drain electrode D shorts between N buffer 42 and P drain 44, thereby temporarily forming a "shorted anode structure". In this case, a current gain of the PNP transistor becomes zero. Electrons accumulated in the device are rapidly discharged through N buffer 42, channel CH2, and N+source 46. Holes migrate into source electrode layer 38 through P base 32. This state is substantially equivalent to a state wherein P and N bases 32 and 30 are reverse-biased.

With the conductivity-modulation MOSFET according to the embodiment of the present invention, gate G2 is activated to invert channel CH2, and N buffer layer 30 is electrically shorted with electrode layer 10 constituting drain electrode D, thereby providing the "shorted anode structure". Therefore, the turn-off speed of the MOSFET can be increased. In this case, unlike in the conventional MOSFET, since the carrier lifetime need not be shortened, the current gain of the PNP transistor in the turn-on state of the MOSFET can be increased. As a result, even if the thickness of N base diffusion layer 30 is increased, its forward voltage drop can be kept small, and the turn-on voltage of the MOSFET can be maintained low. Therefore, the conflicting problems which the conventional conductivity-modulation MOSFET suffers can be simultaneously solved.

According to the above embodiment, the device structure in the turn-off mode is equivalent to a diode constituted by P and N bases 16 and 14. This means that the MOSFET has a reverse-conducting diode therein (N buffer 42 serves as an N emitter to decrease a forward voltage drop of the reverse-conducting diode). When the diode is reverse-biased, a current flows through a path constituted by source electrode 38, P base 32, N base 30, N buffer 42, channel CH2, N+source 46, and drain electrode layer 48. The presence of the diode is particularly effective when the device structure of the present invention is applied to a high-voltage MOSFET which deals with 2,000 volts or higher.

It is important, in the conductivity-modulation MOSFET of the present invention, that the "shorted anode structure" is temporarily formed in the device only when it is driven to be turned off. When the N buffer layer 42 is electrically shorted with drain electrode D, carriers (electrons, in this case) accumulated in N−base 30 in a turn-off mode can be rapidly disappeared, since the current gain of the above-mentioned PNP transistor is reduced to zero and hence the tail current components of the turn-off current can be very small. However, if the "shorted anode structure" is always formed in the MOSFET throughout turn-on/off control, turn-on characteristics may be impaired. If N buffer 42 is electrically shorted with drain electrode D in the turn-on mode, injection of holes from P drain 44 into N buffer 42 is suppressed, and the effect of conductivity modulation cannot be sufficiently obtained, thus undesirably increasing the turn-on voltage. In consideration of the above problem, according to the present invention, second gate electrode G2 is provided as the OFF gate, and during turn-on control of the MOSFET, N buffer 42 is forcibly disconnected from drain electrode D, thereby disappearing the "shorted anode structure".

It should be noted that in the above embodiment, applications of a turn-on/off controlling voltage to gates G1 and G2 can be delayed from one another so that OFF gate G2 is turned on faster than ON gate G1. Preferably, a few microseconds before a voltage application to ON gate G1, more preferably, 1 μs or more before a voltage application to ON gate G1, OFF gate G2 is applied with a positive voltage. An application of a positive voltage for turn-off control allows a further increase in the turn-off speed of the conductivity-modulation MOSFET. The reason therefor is as follows. A few microseconds before a bias voltage to gate G1 is decreased, if gate G2 is positively biased, N channel CH2 is shunt before the MOSFET is turned off. Therefore, excess carriers inside the MOSFET device can be effectively removed, thus shortening a turn-off time (to be referred to as a "fall-time" hereinafter).

FIG. 3 is a graph showing a calculated inductive turn-off waveform of the aforementioned conductivity-modulation MOSFET device. 0.8 μs and 0.65 μs fall-time could be obtained by adjusting the timing for causing N-channel anode short. As shown in FIG. 3, turn-off controlling gate G2 was positively biased approximately 2 μs before turning off the device or reducing the turn-on controlling gate G1 bias. By creating the N-channel shunt, a few microseconds before turning off the device, the excess carriers inside the device were effectively removed, thus realizing a short fall-time. FIG. 4 shows the electron density distribution change corresponding to FIG. 3. It is clearly seen from FIG. 4 that the excess carriers in the drain side are removed from 0 μs to 1.98 μs through the n-channel shunt. Fall-time can be further reduced by applying a positive bias voltage to gate G2 3 μs before the device is turned off as seen in FIG. 4.

FIG. 5 shows a sectional structure of a conductivity-modulation MOSFET according to a second embodiment of the present invention. The same reference numerals in FIG. 5 denote the similar portions as in FIG. 2: a detailed description thereof will be omitted. In this embodiment, N buffer layer is formed, and therefore, the source and drain structures of the MOSFET are symmetrical with each other on the front and rear surfaces of the wafer. One N type semiconductor layer 50 constitutes an N base. P base diffusion layer 32 and P source diffusion layer 44 are symmetrically formed on the opposing surfaces of N base layer 50. Similarly, N+source layers 34 and 46 are symmetrically formed, thus defining symmetrical channels CH1 and CH2. With this multilayered structure, since no N buffer layer is formed, mobility of electrons and holes inside the device can be improved due to the symmetrical element structure although the withstand voltage of the MOSFET is slightly degraded. The symmetrical device structure is also advantageous in mass production.

According to an embodiment shown in FIG. 6, deep P+diffusion layer 52 is additionally formed in P drain layer 44 located beneath drain electrode layer 48. P+layer 52 is deeper than P drain 44. As shown in FIG. 6, P+layer 52 overlaps N+layer 46. Addition of P+layer 52 improves injection efficiency of holes on the drain side of the MOSFET.

FIG. 7 is a perspective view of a MOSFET having a double-gate structure according to a fourth embodiment of the present invention, wherein an upper source electrode pattern is shifted from a lower drain electrode pattern through 90 degrees. ON-gate electrode layers (these are designated by identical numerals "36" in FIG. 7) and source electrode layers (these are denoted by identical numerals "38" in FIG. 7) are alternately arranged on the the upper surface of a wafer, i.e., the top surface of N base 30, and slit-like elongated parallel grooves are defined between these layers 36 and 38. These layers 36 and 38 extend along one direction. P base layers 32 and N+source layers 34 are elongated along the extending direction of layers 36 and 38. It is to be noted that layers 36 or 40 are covered by an insulative layer such as an SiO2 film, and layers 38 or 48 are formed on the entire surface of the insulative layer, in practice.

OFF-gate electrode layers (these are designated by identical numerals "40" in FIG. 7) and drain electrode layers (these are denoted by identical numerals "48" in FIG. 7) are alternately arranged on the rear surface of the wafer, i.e., on the surface of N buffer 42, slit-like parallel elongated grooves are defined between these layers 36 and 38. These layers 40 and 48 extend in a direction shifted from the extending direction of layers 36 and 38 by 90 degrees. P drain layers 44 and N+diffusion layers 46 formed therebelow are elongated along the extending direction of layers 40 and 48. If such an electrode pattern is adopted, local concentration of a turn-on current inside the wafer is moderated, and a current distribution can be made uniform.

According to an embodiment shown in FIG. 8, upper source electrode pattern extends in the same direction as that of a lower drain electrode pattern and is shifted therefrom by half an interval (pitch). Therefore, source electrodes 38 and drain electrodes 48 are inhibited from directly opposing each other, and ON-gate electrodes 36 and OFF-gate electrodes 40 are also inhibited from directly opposing each other. More specifically, as shown in FIG. 6, ON-gate electrode layer 36 faces drain electrode layer 48, and OFF-gate electrode layer 40 faces source electrode layer 38. When such an arrangement of electrode layers is employed, holes can be rapidly injected from P drain 44 into a region of N base layer 30 to which electrons are supplied from N+source 34, thus allowing efficient conductivity modulation.

Figure 9:
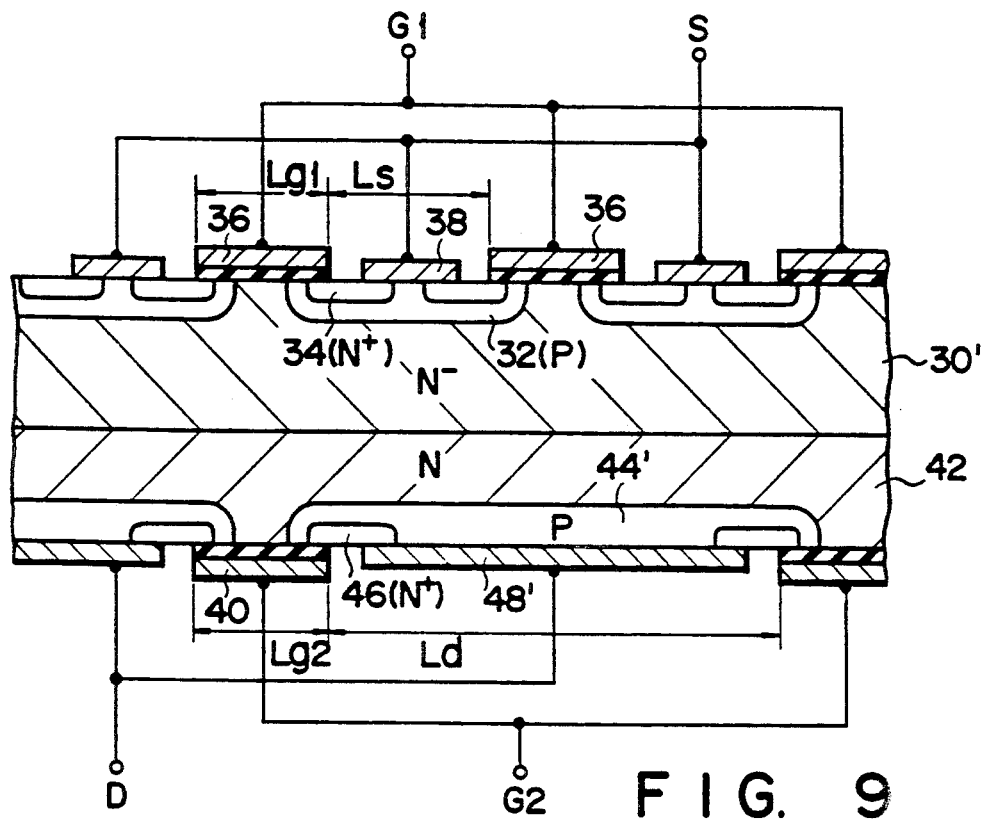

According to an embodiment shown in FIG. 9, electrode layers are fabricated so that the relation among width Lg1 of ON-gate electrode layer 36, source width Ls, width Lg2 of OFF-gate electrode layer 40, and drain width Ld satisfies the following inequality:

$$(Ls+Lg1)<(Lg2+Lg) \qquad (1)$$

Figure 10:
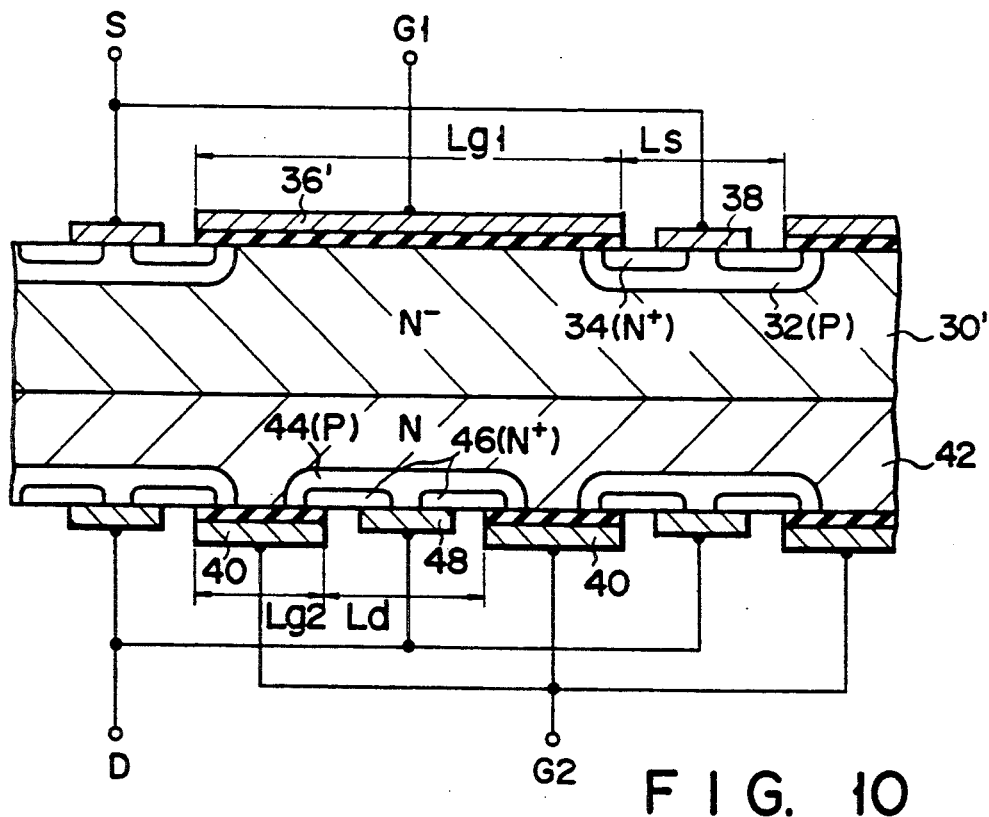

According to an embodiment shown in FIG. 10, electrode layers are fabricated so that the relation among width Lg1 of ON-gate electrode layer 36, source width Ls, width Lg2 of OFF-gate electrode layer 40, and drain width Ld satisfies the following inequality:

$$(Ls+Lg1)>(Lg2+Lg) \qquad (2)$$

When the patterns of the electrode layers are set as described above, injection efficiency of holes can be improved.

Figure 11:
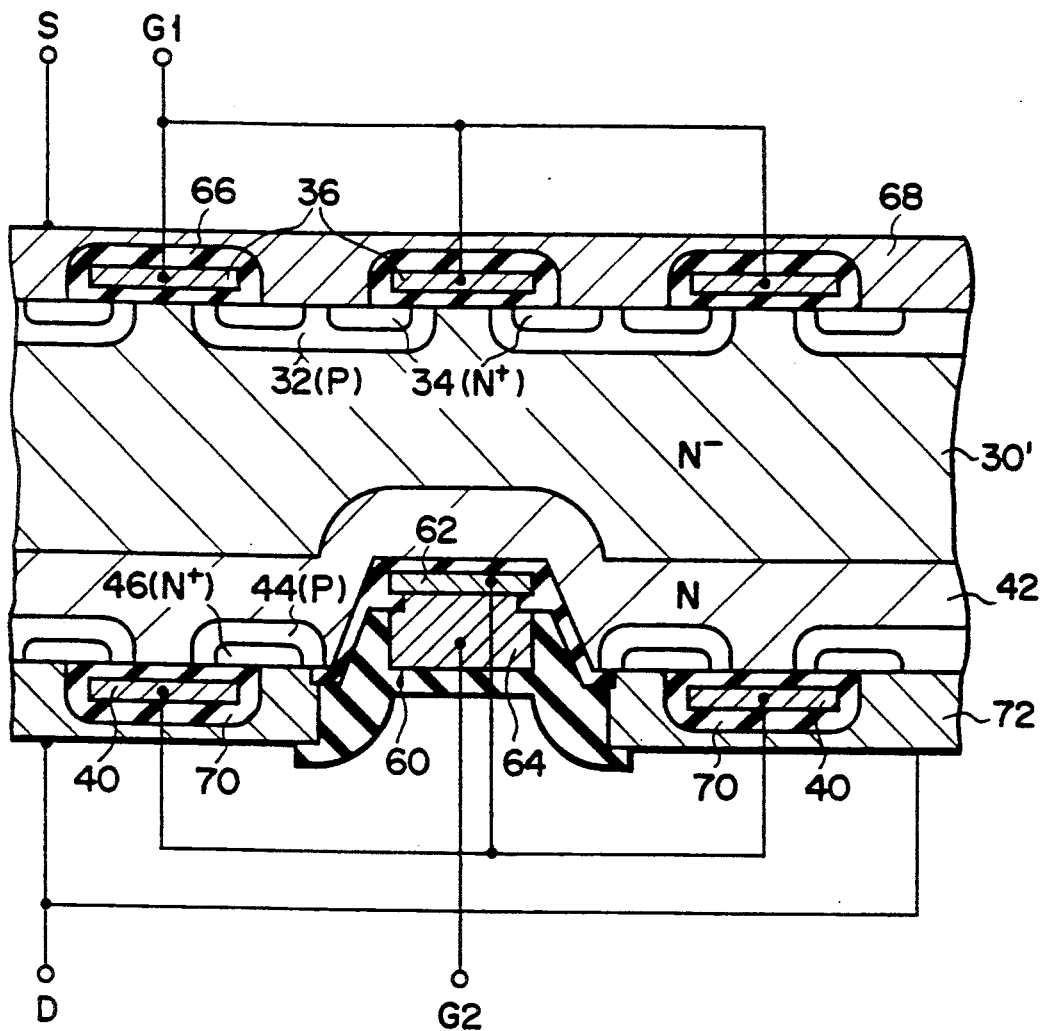

According to an embodiment shown in FIG. 11, OFF-gate electrode layer 60 has a double-layered structure of polycrystalline silicon layer 62 and metal layer 64. When this MOSFET is used as a high-voltage application element, a gate electrode layer has an increased area. When a gate layer comprises a polycrystalline layer having a relatively high resistivity, a gate resistance is undesirably increased. In the embodiment of FIG. 11, metal layer 64 is stacked on polycrystalline gate layer 62 to form double-layered gate layer 60 having a reduced resistance. Double-layered gate layer 60 is buried deep in N buffer layer 42 to prevent the top surface of double-layered gate layer 60 from projecting from N buffer layer 42. Therefore, the drain side of the MOSFET device can be stably mounted on a known base plate (not shown).

In FIG. 11, ON-gate electrode layer 36 is covered with insulation layer 66. Metal layer 68 is formed on lightly-doped N type base layer 30' so as to cover ON-gate electrode layers 36. Metal layer 68 serves as a common source electrode of the MOSFET. Each drain electrode layer 40 provided on the opposite side of the MOSFET, i.e., on N buffer layer 42, is covered with insulation layer 70. Metal layer 72 is formed on layer 42 to cover OFF-gate electrode 40. Metal layer 72 serves as a common drain electrode of the MOSFET.

FIG. 12 is a cross-sectional view of a main part of a conductivity-modulation MOSFET having a horizontal double-gate structure (which is also an embodiment of the present invention). Unlike in the MOSFET device structures shown in FIG. 2 and FIGS. 5 to 11 wherein the source and drain are formed on opposite surfaces, the source and drain of the MOSFET are formed on a single surface of $N^-$base layer 80, according to this embodiment. Lightly-doped N type ($N^-$type) silicon wafer 80 is used as an $N^-$base layer of the MOSFET. Heavily-doped N type ($N^+$type) buffer layer 82 is formed on one surface of silicon wafer 80. Electrode layer 82 is formed on buffer layer 82.

P type diffusion layers 84 and 86 are formed on the other surface (front surface) of silicon wafer 80. P type diffusion layers 84 and 86, serve as P base and P drain layers respectively. $N^+$type layers 88 and 90 are respectively formed in P base and P drain layers 84 and 86 to define channel regions CH1 and CH2. Source electrode layer 92 is deposited on wafer 80 to render layers 84 and 86 electrically conductive to each other. Drain electrode layer 94 is deposited on wafer 80 to render layers 86 and 90 electrically conductive to each other. First gate electrode layer 96 serving as an ON-gate insulatively covers channel CH1, and constitutes a turn-on controlling transistor of the MOSFET. According to the conductivity-modulation MOSFET having the horizontal double-gate structure described above, since all the necessary layer patterns are formed on one surface of wafer 80 in addition to the aforementioned technical advantages, mounting of the device in a package (not shown) can be facilitated. In addition, internal connection wiring with terminal pins of the package can also be facilitated.

According to a more preferable embodiment shown in FIG. 13, $P^-$type silicon wafer 100 is used in place of $N^-$type silicon wafer 80 in the embodiment shown in FIG. 12. Heavily-doped ($P^+$type) buffer layer 102 is formed on one surface of $P^-$type silicon wafer 100. Since $P^-$type silicon wafer 100 is used, N type diffusion layer (drain isolation layer) 104 is necessary for electrically insulating P type diffusion layer 86 from wafer 100. Layer 104 can be formed in a self-aligned manner with layers 90 and 86, and serves as an N buffer, which acts as an N emitter to decrease a voltage drop generated when the device operates as a reverse conducting diode. Lightly-doped N type ($N^-$type) diffusion layer 106 is formed shallow in the surface portion of wafer 100, and can be connected to layer 104. Shallow $N^-$type diffusion layer 106 serves as an N base layer to which electrons are injected from first $N^+$source diffusion layer 88. As with the embodiment shown in FIG. 12, the embodiment shown in FIG. 13 includes ON-gate electrode layer 96 and OFF-gate electrode layer 98. It was experimentally demonstrated by the present inventors that when shallow diffusion layer 106 had an impurity concentration of about $5 \times 10^{11}$ to $4 \times 10^{12}/cm^2$, the withstanding voltage of the transistor structure was maximized, and a sufficiently low turn-on resistance could be obtained.

According to the two embodiments described above, when the source and drain of the conductivity-modulation MOSFET are formed on one surface side of a substrate, careful attention should be directed to the following two points. First, in the turn-off mode of the MOSFET, a two-dimensional pattern of the source and drain of the MOSFET should be carefully designed such that a depletion layer in a junction portion at which a reverse bias voltage is applied is uniformly expanded, and a deviated internal electric field distribution is minimized in that portion. Second, when one MOSFET is cut from a large number of MOSFETs formed on a wafer, or when element isolation is made between the MOSFETs using dielectric layers, the two-dimensional pattern of the source and drain of the MOSFET should be carefully designed so that necessity of addition of a special passivation to each element boundary portion is eliminated. Embodiments of two-dimensional patterns of conductivity-modulation MOSFETs having horizontal double-gate structure which can fully meet the requirements on device design will be presented and explained below.

Figure 14:
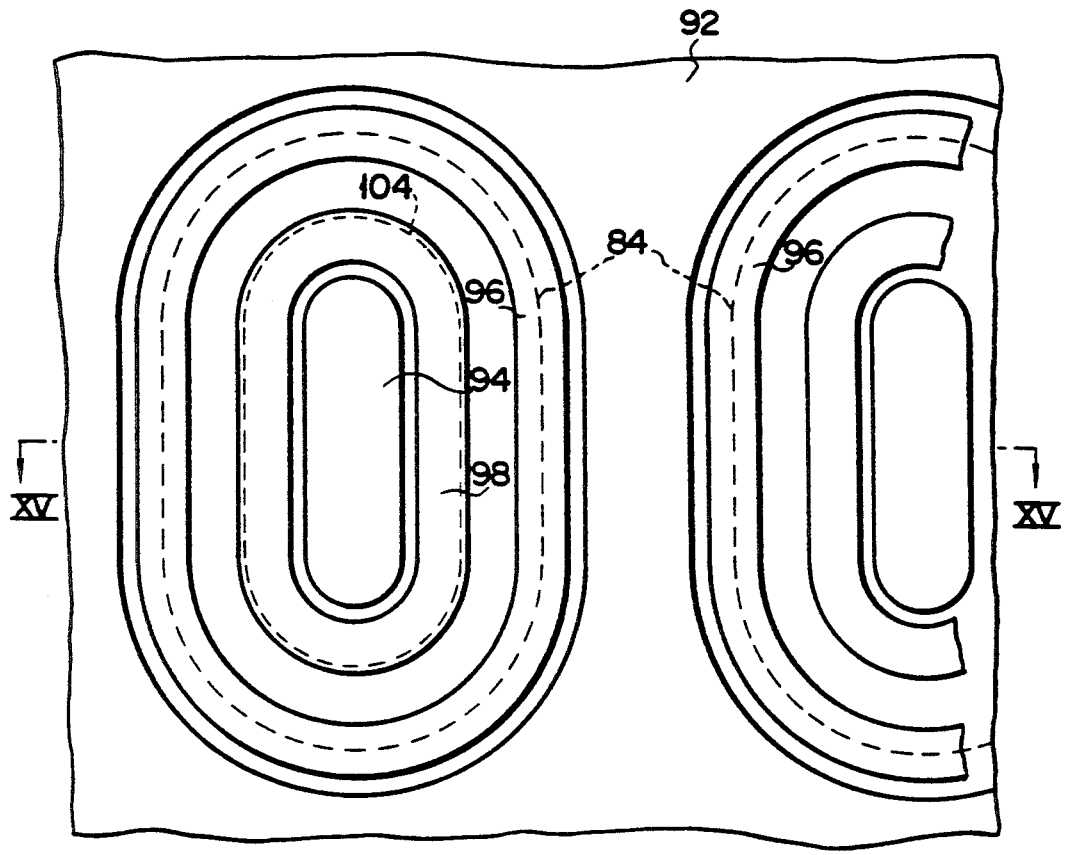
FIG. 14 is a diagram showing a plan view of a main part of a conductivity-modulation MOSFET having a horizontal double-gate structure according to still another embodiment of the present invention.
Figure 15:
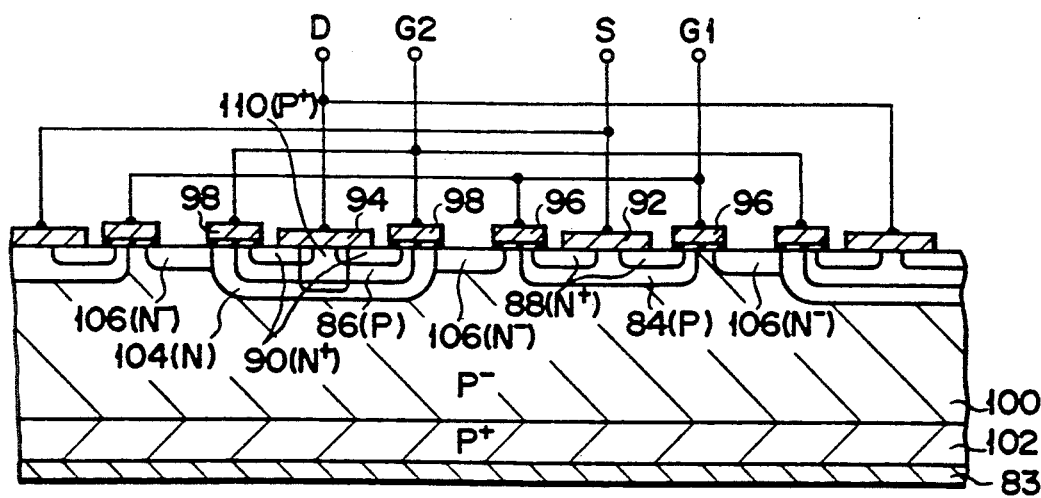
FIG. 15 is a diagram showing a sectional structure taken along a line XV—XV of the device shown in FIG. 14.

According to an embodiment shown in FIGS. 14 and 15, drain isolation diffusion layer 104 is formed on a front surface portion of wafer 100 to define island layers. In the plan view of FIG. 14, one island drain isolation diffusion layer 104 is indicated by broken line. P drain diffusion layer 86 is formed in each drain isolation diffusion layer 104 (see FIG. 15). Second $N^+$type source layer 90 is formed in layer 86 to have an elliptical ring shape. Heavily-doped diffusion layer 110 of P type conductivity is formed deep in the central region of each P drain diffusion layer 86. Shallow $N^-$diffusion layer 106 two-dimensionally surrounds island drain isolation diffusion layer 104. $N^-$diffusion layer 106 is connected to each island drain isolation diffusion layer 104, as shown in FIG. 15.

Drain electrode 94 is directly formed on the surface of wafer 100 to overlap $P^+$type layer 110. Drain electrode 94 has an elliptical shape, as clearly illustrated in FIG. 14. OFF-gate electrode layer 98 is insulatively formed above wafer 100 to surround drain electrode 94. OFF-gate electrode layer 98 has an elliptical ring shape. ON-gate electrode layer 96 is insulatively formed above wafer 100 to surround OFF-gate electrode layer 98 and to have an elliptical ring shape. Conductive layer 92 serving as source electrode S two-dimensionally surrounds ON-gate electrode layers 96 formed on wafer 100 in the manner as described above, as shown in FIG. 14. P base layer 84 formed on the surface of wafer 100 two-dimensionally surrounds island diffusion layers 104 each of which includes drain layer 86 (see FIG. 14). Electrode layer 83 formed on the rear surface of wafer 100 is, e.g., grounded.

According to this embodiment having the above-mentioned two-dimensional pattern, P base layer 84 is designed to surround island drain regions 86. Therefore, when one MOSFET element is isolated from wafer 100, or when one element is electrically insulated from other elements formed on single wafer 100, an element boundary is formed in each P base layer 84, thus facilitating setting of passivation in each P base layer 84.

Further, according to this embodiment, a junction portion which is reverse-biased in the turn-off mode of the MOSFET is formed between P⁻wafer 100 and a diffusion layer portion comprising N type drain isolation diffusion layer 104 surrounding P drain 86 and shallow N⁻layer 106 provided around layer 104. When the junction portion is reverse-biased, a depletion layer radially expands outwardly from the elliptical diffusion layer portion in wafer 100, so that local concentration of an electric field in wafer 100 can be satisfactorily suppressed. Therefore, operation reliability of the MOSFET can be improved.

Figure 16:
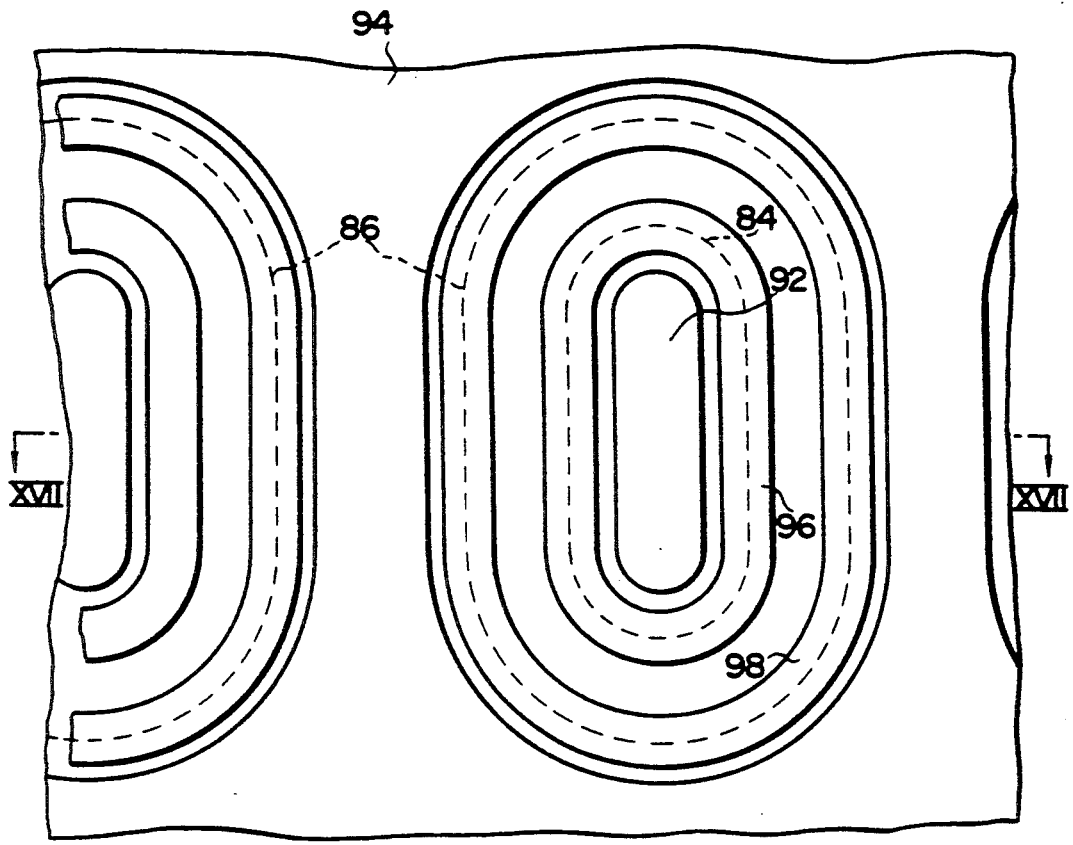
FIG. 16 is a diagram showing a plan view of a main part of a conductivity-modulation MOSFET having a horizontal double-gate structure according to still another embodiment of the present invention.
Figure 17:
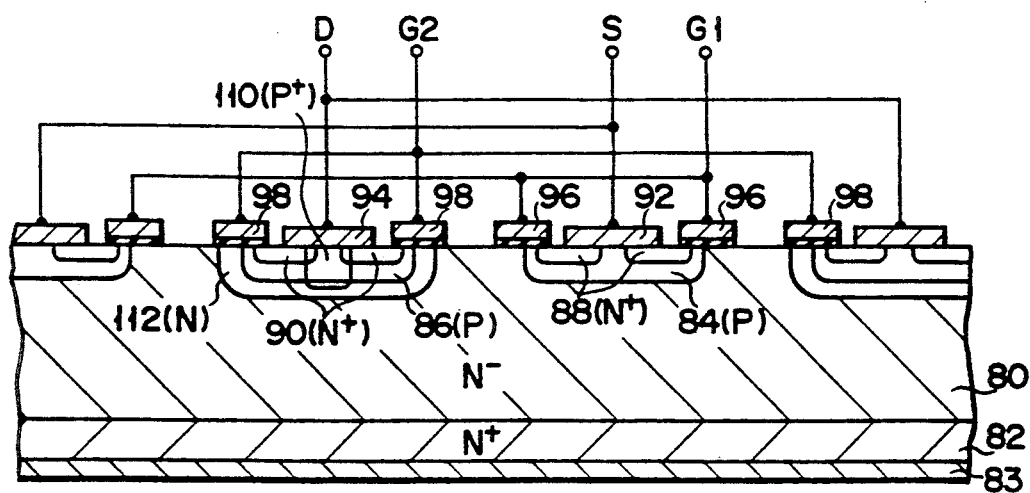
FIG. 17 is a diagram showing a sectional structure taken along a line XVII—XVII of the device shown in FIG. 16.

An embodiment illustrated in FIGS. 16 and 17 has wafer 80 of an N type conductivity. When N type wafer 80 is used as an N base, a junction portion to which a reverse bias voltage is applied in a turn-off mode of the MOSFET is formed between P base diffusion layer 84 and N type wafer 80. Therefore, in contrast to the embodiment shown in FIGS. 14 and 15, each P base layer 84 is formed in N type wafer 80 to have an elliptical island shape, as shown in FIG. 16. P drain diffusion layer 86 and N type diffusion layer 112 including layer 86 are formed continuously with wafer 80 so as to two-dimensionally surround elliptical island P base layers 84. N type layer 112 prevents a depletion layer formed between each P base layer 84 and N type wafer 80 from reaching P drain 86, and hence, prevents a decrease in withstand voltage of the MOSFET.

Second N⁺diffusion layer 88 is formed in each elliptical island P base layer 84 to have a two-dimentionally elliptical ring-shape. Source electrode layer 92 is deposited on wafer 80, located at the central flat region of corresponding island P base layer 84, and has an elliptical shape (see FIG. 16). Electrode layer 96 serving as ON gate G1 is formed on wafer 80 to surround each source electrode layer 92. Electrode layer 98 serving as OFF gate G2 surrounds ON-gate electrode layer 96. More specifically, drain electrode layer 94 is continuously formed on wafer 80 to surround OFF-gate electrode layers 98. Electrode layer 83 formed on the rear surface of wafer 80 is set at a drain potential.

When the element of this embodiment is turned off, a depletion layer expands in wafer 80 on the side of the source region. Therefore, expansion of the depletion layer can be uniformed, and local concentration of an internal electric field can be suppressed, in the same manner as in the above embodiment shown in FIGS. 14 and 15. Furthermore, since the two-dimensional pattern is employed, special passivation at boundaries of elements formed on wafer 80 can be facilitated or omitted.

Figure 18:
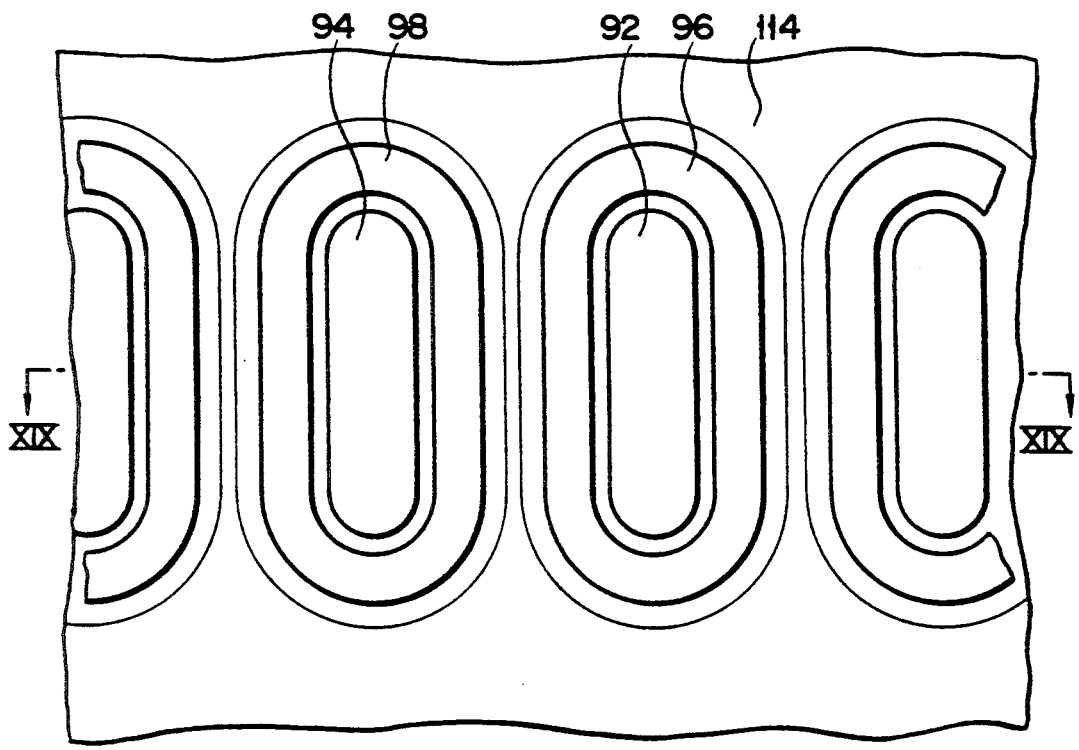
FIG. 18 is a diagram showing a plan view of a main part of a conductivity-modulation MOSFET having a horizontal double-gate structure according to still another embodiment of the present invention.
Figure 19:
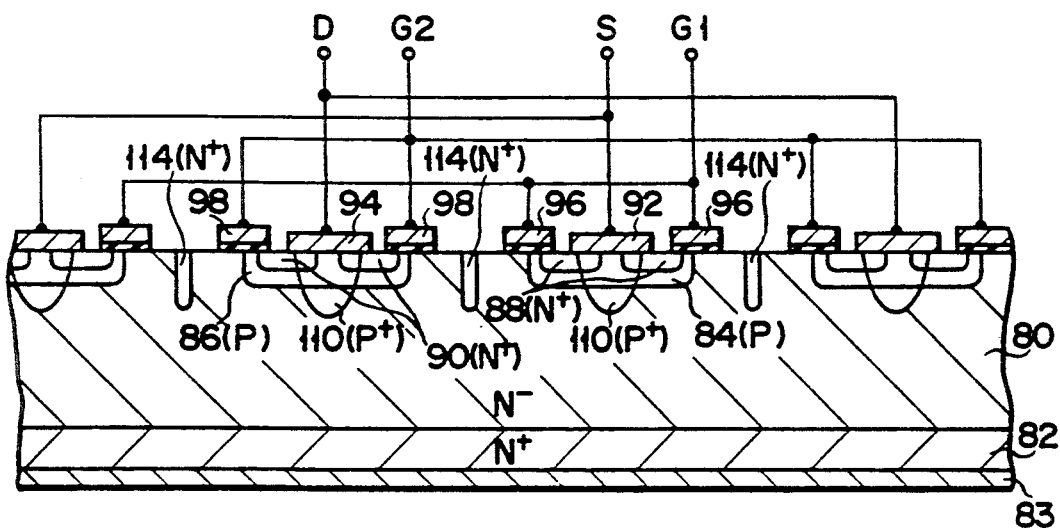
FIG. 19 is a diagram showing a sectional structure taken along a line XIX—XIX of the device shown in FIG. 18.

According to an embodiment shown in FIGS. 18 and 19, both source and drain regions alternately arranged on wafer 80 are formed to have an elliptical shape, as shown in FIG. 18. Each source electrode layer 92 is formed on wafer 80 to be located on the central flat region of corresponding island P base layer 84 and to have an elliptical shape (see FIG. 16). ON-gate electrode layer 96 surrounds source electrode layer 92. Each drain electrode layer 94 is formed or wafer 80, located on the central flat region of corresponding island P drain diffusion layer 86, and has an elliptical shape (see FIG. 16). OFF-gate electrode layer 98 surrounds drain electrode layer 94.

N⁺diffusion layer 114 is continuously formed on the surface portion of wafer 80 to surround the source and drain regions. A drain potential is applied to N type wafer 80 through P drain 86 and P⁺layer 110 which are forward-biased. Therefore, continuous N⁺diffusion layer 114 is formed so that a necessary potential can be applied to the junction portion of each island P base layer 84 without a drain electrode provided on one entire surface of wafer 80 in the embodiment shown in FIGS. 16 and 18. With this structure, the effects of suppressing internal electric field concentration and of facilitating element isolation can also be provided.

Figure 20:
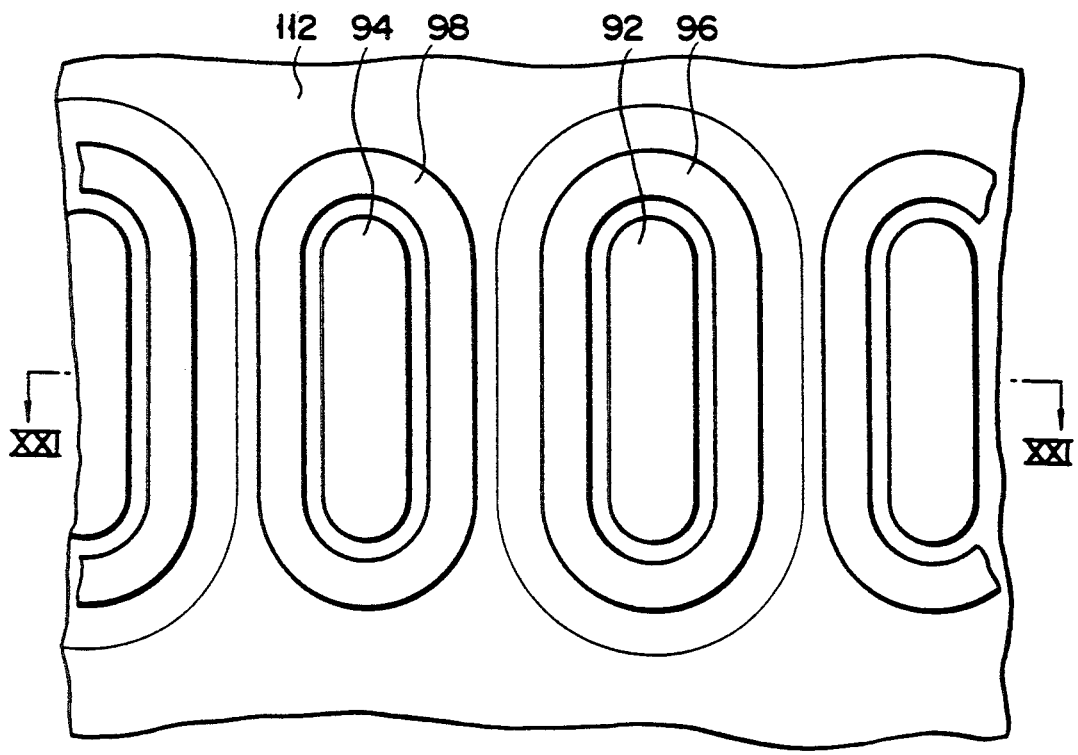
FIG. 20 is a diagram showing a plan view of a main part of a conductivity-modulation MOSFET having a horizontal double-gate structure according to still another embodiment of the present invention.
Figure 21:
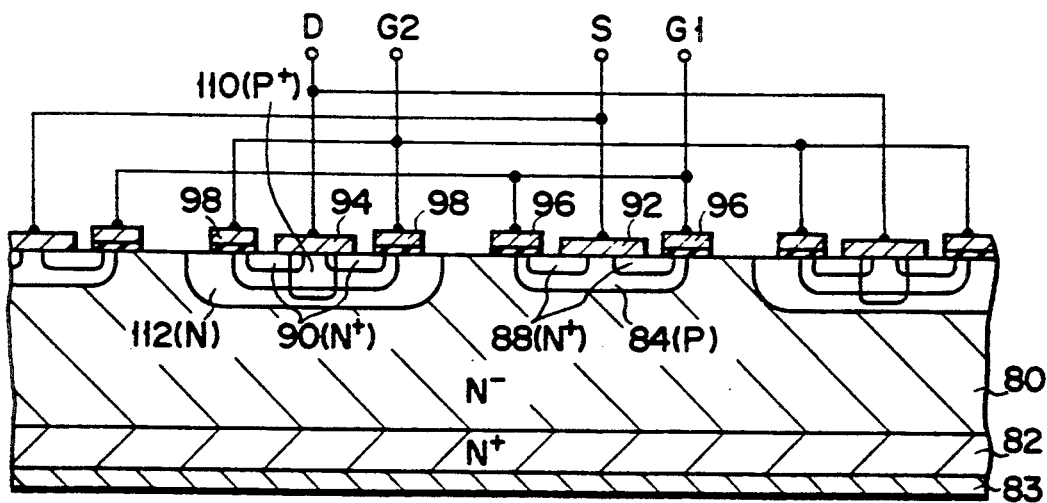
FIG. 21 is a diagram showing a sectional structure taken along a line XXI—XXI of the device shown in FIG. 20.

According to an embodiment shown in FIGS. 20 and 21, both source and drain regions alternately arranged on wafer 80 are formed to have an elliptical shape in the same manner as in the embodiment shown in FIGS. 18 and 19 (see FIG. 19). N type diffusion layer 112 in which drain regions are formed is continuously formed on the entire surface of wafer 80, as shown in FIG. 20. N type diffusion layer 112 has the same function as N⁺diffusion layer 114 shown in FIGS. 18 and 19. With this structure, the same effects as in the above embodiments can be provided.

FIG. 22 is a cross-sectional view of a main part of a conductivity-modulation MOSFET having a horizontal double-gate structure according to an embodiment of the present invention. According to the device of this embodiment, the source and drain of the MOSFET are formed on the front surface of P⁻type wafer substrate 200 and adjacent to each other. Wafer 200 is used as a P base layer of the MOSFET. P⁺type layer 202 is formed on the rear surface portion of wafer 200. Electrode layer 203 is formed on layer 202.

P type diffusion layers 204 and 206 are formed on the front surface of silicon wafer 200. P type diffusion layers 204 and 206 respectively serve as P base and P drain layers. Layer 204 consists of P type diffusion layer 204a and relatively deep P⁺type diffusion layer 204b. N⁺type diffusion layer 208 is formed in P base diffusion layer 204. Layer 208 defines channel region CH1 in layer 204a. N⁺type diffusion layer 210 is formed in P drain layer 206, and defines channel region CH2 in layer 206.

Source electrode layer 212 is deposited on wafer 200 to render layers 204b and 208 electrically conductive to each other, and drain electrode layer 214 is deposited on wafer 200 to render layers 206 and 210 electrically conductive to each other. First gate electrode layer 216 serving as an ON-gate insulatively covers channel CH1 and constitutes a turn-on controlling transistor of the MOSFET. Second gate electrode layer 218 serving as an OFF-gate insulatively covers channel CH2 and constitutes a turn-off controlling transistor of the MOSFET.

It is to be noted that N type diffusion layer 220 is formed on the front surface portion of wafer 200 to include P drain layer 206 therein. N type diffusion layer 220 serves as an N buffer. N⁻type diffusion layer 222 which is connected to buffer 220 and extends immediately below gate G1 is formed on the front surface portion of wafer 200. Layer 222 serves as an N base.

Furthermore, according to this embodiment, N type impurity ions are implanted in channel region CH2 which is defined on the surface portion of wafer 200 so as to be located below second gate electrode 218 which serves as OFF gate G2, as clearly illustrated in FIG. 22. In other words, N⁺drain 210 is conducted to N⁻type isolation layer 220 through N⁻type diffusion section (to be referred to as an "N bypass layer" hereinafter) 224 of channel region CH2. Since the impurity concentration of the N⁻type diffusion section is relatively very low (e.g., about $1 \times 10^{11}$ to $1 \times 10^{13}/cm^2$), a conductance between N⁺drain 210 and N⁻type isolation layer 220 is relatively low, and a lateral resistance therebetween is relatively high. In this sense, N⁺drain 210 is half-conducted to N base 220 through N bypass layer 224 of channel region CH2. Alternatively, a turn-off controlling switch section having OFF gate G2 is normally rendered half-conductive.

According to this embodiment, the turn-off controlling switch section having OFF gate G2 which is rendered conductive in the turn-off mode of the conductivity-modulation MOSFET is rendered half-conductive in other operation modes. For example, when a positive voltage is applied to source electrode 212 in in order to turn on the MOSFET, electrons are injected from N+source 208 into N base 222. These electrons flow into N+layer 210 through N bypass layer 224. In this case, a potential difference is generated by the lateral resistance of N bypass layer 224. The lateral potential difference forward-biases the PN junction portion between P drain 206 and N buffer 220. Upon forward-biasing, holes are injected from P drain 206 into N base 222. N base 222 is thus subjected to conductivity modulation, and the MOSFET can be turned on at a relatively low turn-on controlling voltage.

When a zero or negative voltage is applied to ON gate G1, and OFF gate G2 is positively biased so as to turn off the MOSFET, injection of electrons from the source is interrupted. Electrons accumulated in N base 222 are discharged into N+layer 210 through N bypass layer 224. Holes accumulated in N base 222 are discharged into source electrode 212 through P base 204.

According to this embodiment, N bypass layer 224 for half-conducting N+drain 210 and N base 220 is provided to channel region CH2. The potential difference for forward-biasing the PN junction portion of P drain 206 in the turn-on mode of the MOSFET is generated in N bypass layer 224. The lateral resistance of N bypass layer 224 can be desirably increased by controlling the concentration of impurities injected into channel region CH2. Therefore, even if the impurity concentration of N buffer 220 is increased to relatively high, a desired high withstand voltage of the element can be maintained. This contributes to realization of a conductivity-modulation MOSFET having good turn-off characteristics (capable of high-speed turn-off switching) and a high withstand voltage.

According to an embodiment shown in FIG. 23, formation position of drain electrode 214 and OFF gate electrode 218 on wafer 200 are reversed to those in the embodiment shown in FIG. 22. More specifically, gate electrode 218 of a turn-off controlling switch section is formed outside N+layer 210 and separated from N base 222. Therefore, channel region CH2, which is located below electrode layer 218 serving as OFF gate G2 and in which N bypass layer 224 is formed, is also defined outside N+layer 210, as shown in FIG. 23. With this structure, the same effects as described above can be provided.

In the embodiment shown in FIG. 12, the impurity concentration of channel region CH2 defined in P drain layer 86 cannot exceed $5 \times 10^{16}$ to $1 \times 10^{17}/cm^3$ in consideration of threshold voltage level Vth of the turn-off controlling switch section. In this case, effective conductivity modulation of the MOSFET cannot always be performed, since it cannot be expected that holes are effectively injected from P drain 86. Modifications suitable for a case wherein injection efficiency of holes from the P drain layer must be improved in the conductivity-modulation MOSFET having the horizontal double-gate structure will be presented below.

Figure 24:
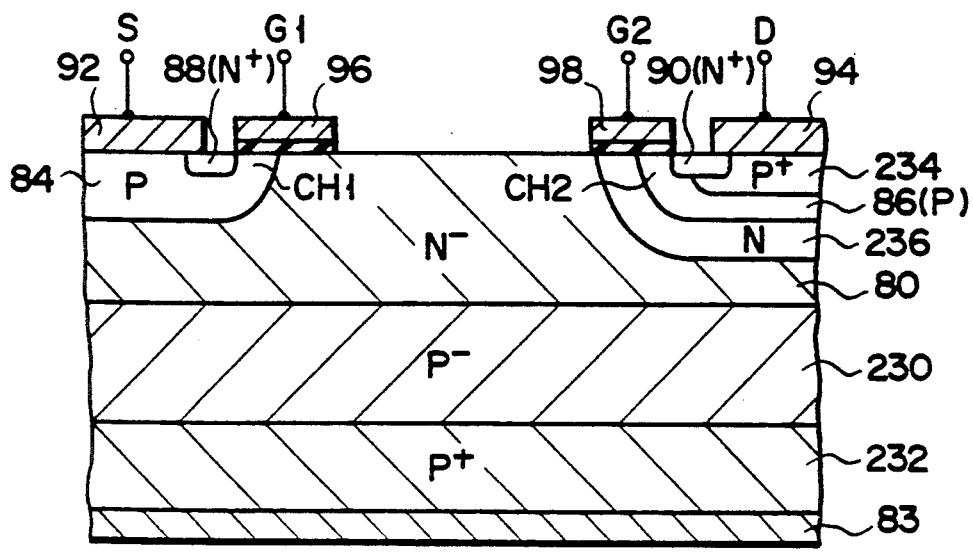

According to a modification shown in FIG. 24, P−type diffusion layer 230 and P+type diffusion layer 232 are formed on the rear surface portion of N type wafer 80. Second N+diffusion layer 90 and shallow P+type diffusion layer 234 are formed in P drain layer 86 formed on the front surface portion of N type wafer 80. P+layer 234 overlaps N+diffusion layer 90 and is adjacent to channel region CH2, as illustrated in FIG. 24. Deep N type diffusion layer 236 is formed in wafer 80 to surround P drain layer 86. Since shallow P+type diffusion layer 234 is additionally formed in P drain layer 86, the injection efficiency of holes from the P drain can be effectively improved without increasing the impurity concentration of channel region CH2.

Figure 25:
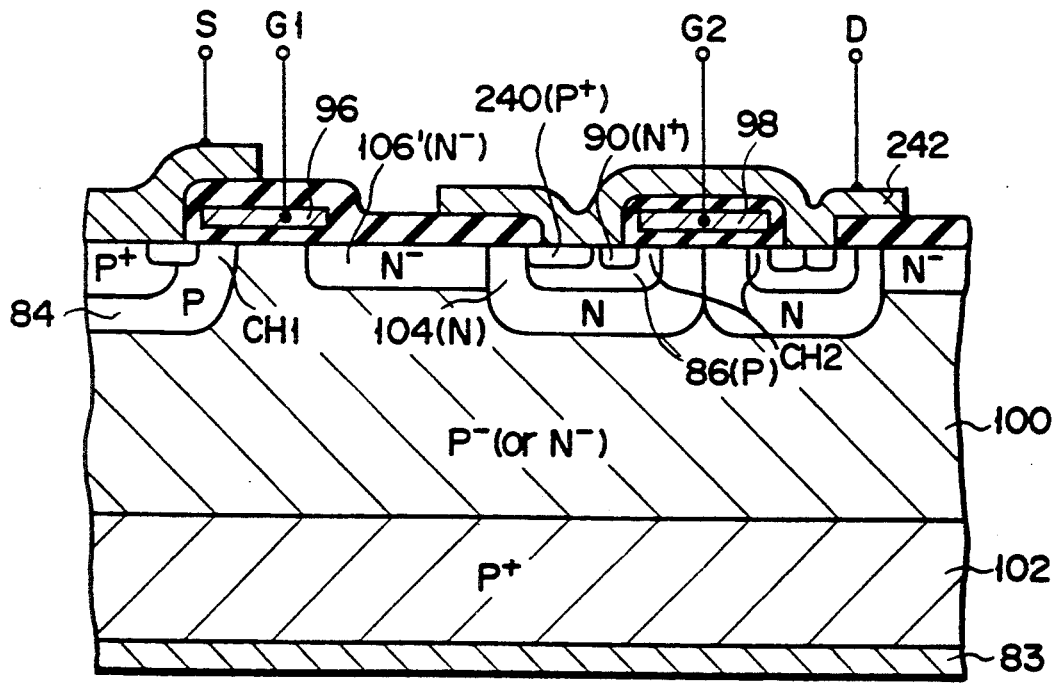

According to a modification shown in FIG. 25, in order to improve the injection efficiency of holes from P drain 86, electrode layer 98 serving as OFF gate G2 is insulatively provided above P−type wafer 100 so as to be distant from the source region of the device. Shallow P+type diffusion layer 240 is formed in P drain layer 86 on the side of the source region. Drain electrode layer 242 is formed on wafer 100 to be in electrical contact with N+layer 90 and P+layer 240 in P drain layer 86, as shown in FIG. 25. During manufacture of the device with the above structure, N buffer layer 104, P drain 86, and N+layer 90 can be easily fabricated in wafer 100 by a triple diffusion technique using the edge portion of one end of OFF gate electrode layer 98 as one end of a window opening of a diffusion mask.

Although the conductivity-modulation MOSFETs having the double-gate structure have been disclosed in the embodiments of the present invention as described above, the high-speed turn off controlling technique in the conductivity-modulation MOSFETs of the present invention can also be realized in a shorted anode MOSFET having a single-gate structure. Embodiments of such conductivity-modulation MOSFETs will be described below.

Figure 26:
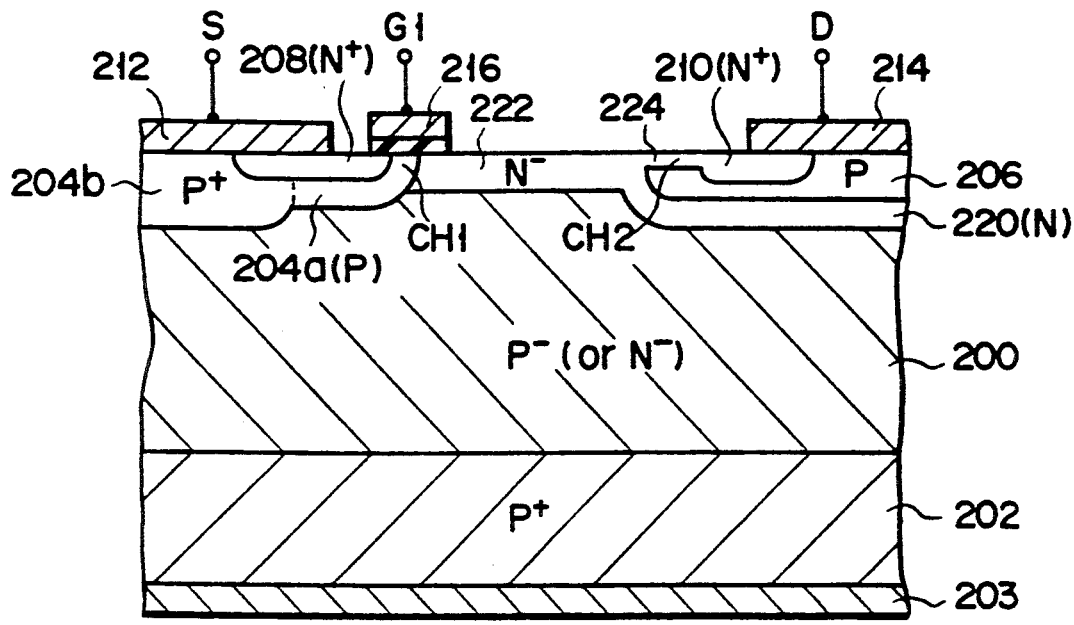
FIGS. 26 to 28 are diagrams showing sectional structures of main parts of conductivity-modulation MOSFETs having horizontal single-gate structures according to still other embodiments of the present invention.

A conductivity-modulation MOSFET shown in FIG. 26 is substantially the same multilayered structure as that shown in FIG. 22, except that turn-off controlling gate G2 is omitted from the MOSFET shown in FIG. 26. Thus, the same reference numerals in FIG. 26 denote the same portions as in FIG. 22, and a detailed description thereof will be omitted. With this structure, N buffer layer 220 is constantly half-connected to drain electrode layer 214 through channel region CH2 in both turn-on and turn-off modes of the conductivity-modulation MOSFET.

When a positive voltage is applied to source electrode 212, electrons are injected from source layer 208 into N base 222. These electrons flow from N base 222 into N+layer 210 through N bypass layer 224. In this case, a potential difference occurs to the lateral resistance of the N bypass layer. The potential difference serves to forward-bias the PN junction between P drain 206 and N buffer 220. Thus, holes are injected from P drain 206 into N base 222, so that N base 222 is subjected to conductivity modulation, and the MOSFET is turned on. When the gate voltage is set to be zero or a negative voltage, injection of electrons from source 208 is interrupted. Electrons accumulated in N base 222 are discharged into N+layer 210 through N bypass layer 224, and holes accumulated in N base 222 are discharged into source electrode 212 through P base 204. Thus, the conductivity-modulation MOSFET is turned off. According to this embodiment, the potential difference for forward-biasing the PN junction occurs in N bypass layer 224, and the lateral resistance for causing the potential difference can be easily controlled by adjusting the impurity concentration of the N bypass layer. Therefore, even if the concentration of the N buffer is desirably increased, a withstanding voltage of the element can be increased without increasing the width of the N bypass layer.

Figure 27:
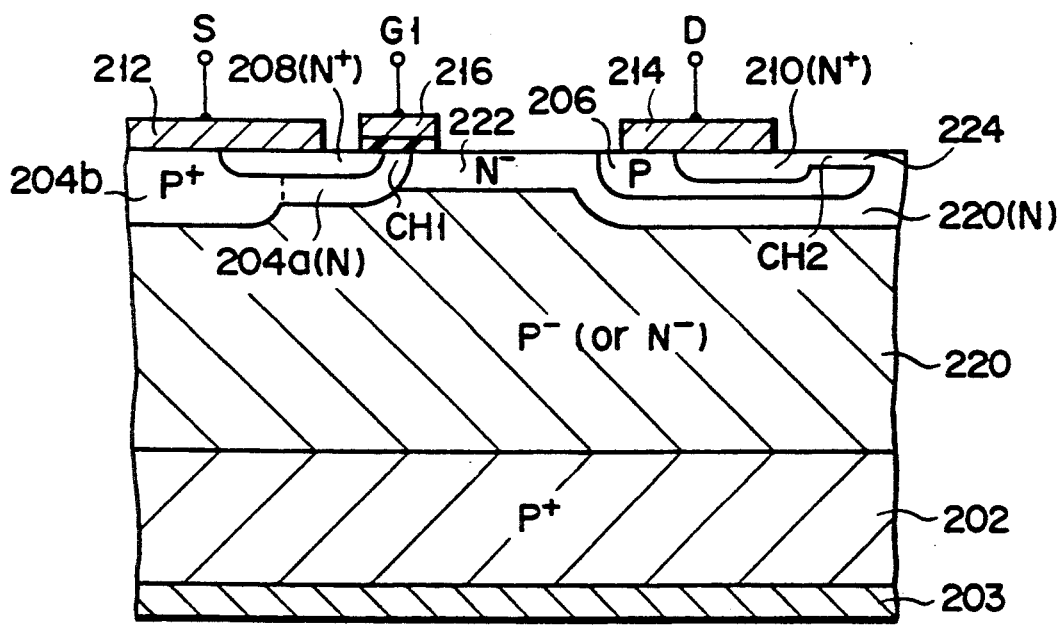
Figure 28:
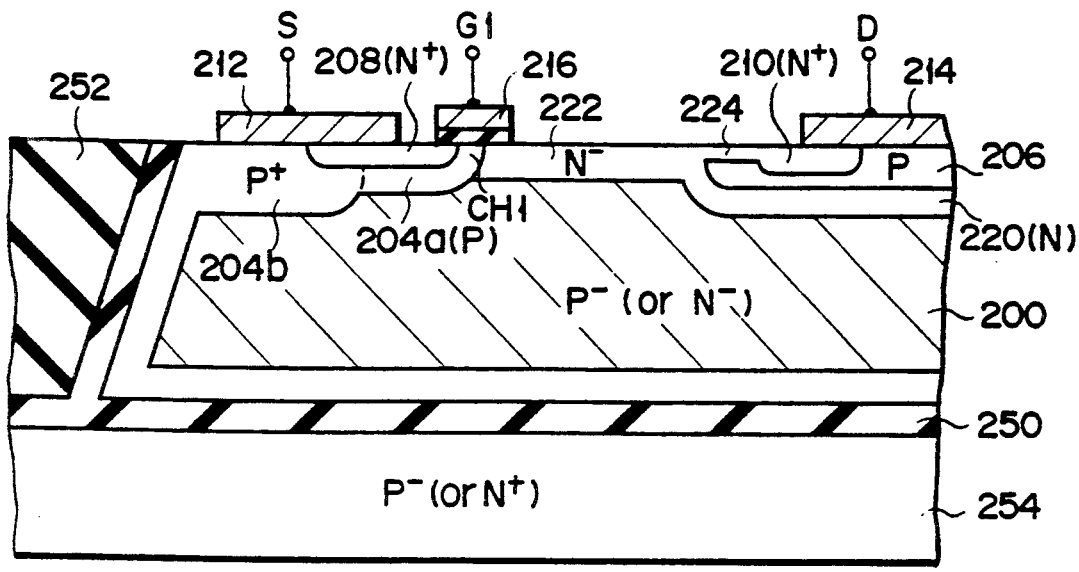
Figure 29:
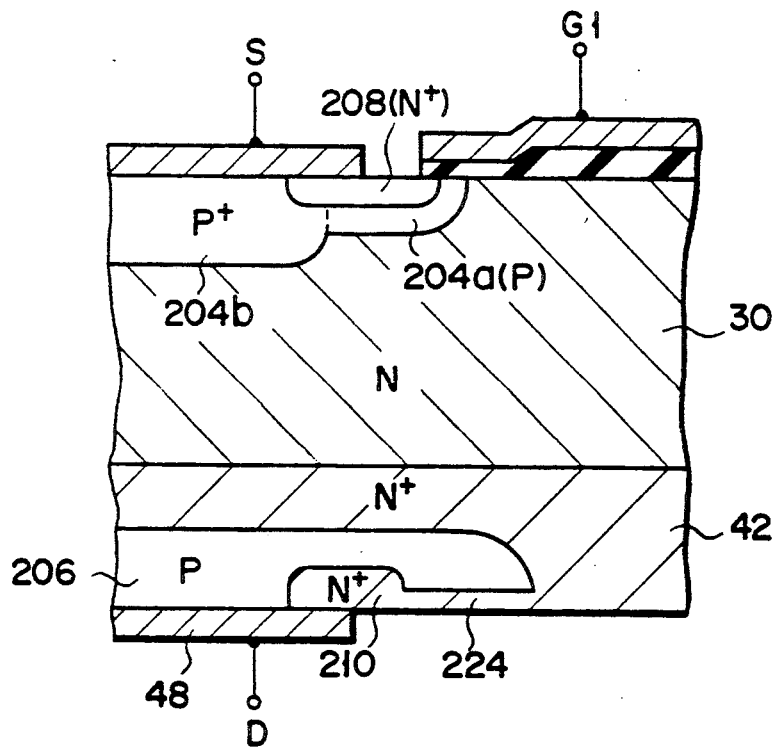
FIG. 29 is a diagram showing a two-dimensional structure of a main part of a conductivity-modulation MOSFET for embodying the present invention.

According to an element structure shown in FIG. 27, N bypass layer 224 is formed outside drain electrode 214. In this case, the same effects as described above can be obtained. According to a conductivity-modulation MOSFET shown in FIG. 28, dielectric element isolation film 250 is formed on supporting substrate 254, and buried isolation layer 252 is formed on film 250, as shown in FIG. 28. In an embodiment shown in FIG. 29, the above structural feature is applied to a vertical shorted anode MOSFET having a single-gate structure, wherein N bypass layer 224 is formed on an opposite surface portion of a substrate.

Although the invention has been described with reference to specific embodiments, it shall be understood by those skilled in the art that numerous modifications may be made that are within the spirit and scope of the inventive contribution. In order to improve injection efficiency of holes from the P drain, according to the embodiment shown in FIG. 24, diffusion layer 234 is added. A two-dimensional pattern of the diffusion layer suitable for this element structure will be explained below.

Figure 30:
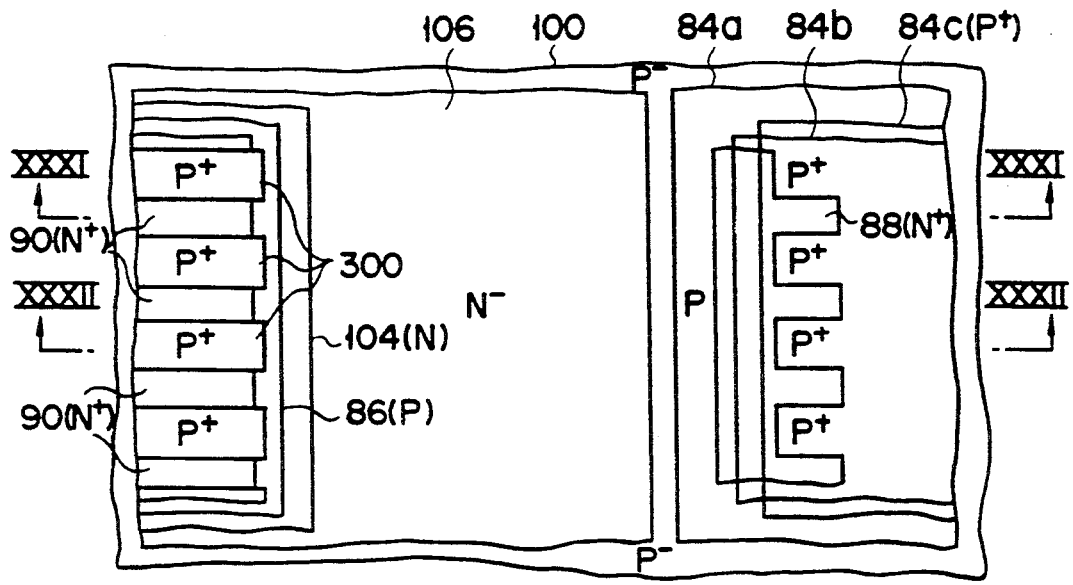
FIG. 30 is a diagram showing a two-dimensional structure of a main part of another conductivity-modulation MOSFET for embodying the present invention.
Figure 31:
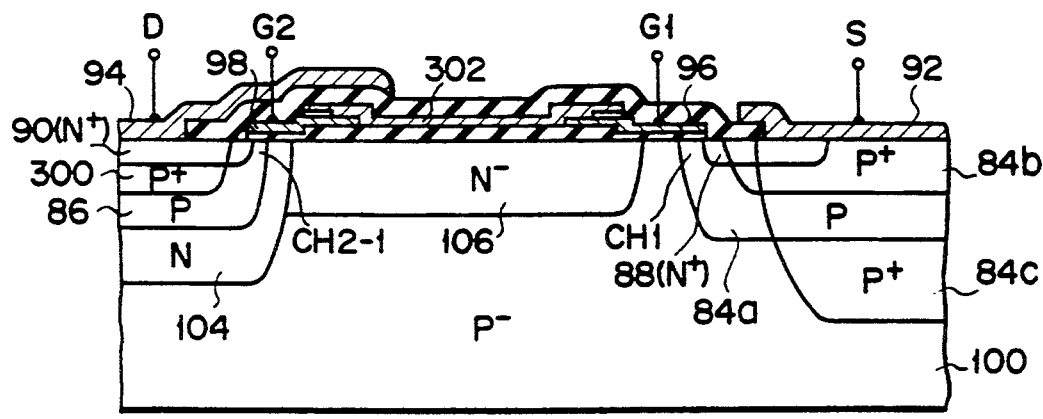
FIGS. 31 and 32 are diagrams showing sectional structures taken along different cutting lines of the device shown in FIG. 30.
Figure 32:
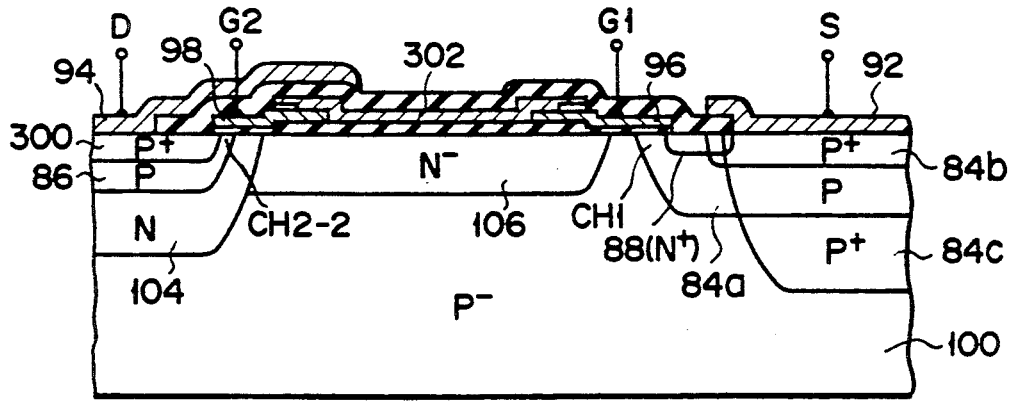

An embodiment shown in FIG. 30 has the same the basic structure as in the embodiment shown in FIG. 13, wherein N drain layer 104 is formed in P−type silicon wafer 100, and P drain diffusion layer 86 and second N+source 90 are formed in layer 104. For the sake of easy visual understanding in FIG. 30, electrodes provided to respective portions are omitted, and only a diffusion layer pattern is visible. FIG. 31 shows a sectional structure taken along a line XXXI—XXXI in FIG. 30, and FIG. 32 shows a sectional structure taken along a line XXXII—XXXII in FIG. 30. In these figures, the same reference numerals denote the same portions as in FIG. 13 or 24, and a detailed description thereof will be omitted.

According to this embodiment, as shown in FIG. 30, second N+source diffusion layer 90 in such a manner that it is divided into a plurality of layers by P type diffusion layers 300. P+layers 300 serve as a part of a drain diffusion layer. In other words, second channel region CH2 below OFF controlling gate electrode 98 is divided into sub channels CH2-1 (see FIG. 31) which contribute to a transistor operation, and sub-channels CH2-2 (see FIG. 32) which do not contribute to the transistor operation. These sub-channels CH2-1 and CH2-2 are alternately arranged when viewed from the top. Since second N+source diffusion layer 90 is divided as described above, injection efficiency of holes from P drain 86 when the MOSFET is rendered conductive can be improved, and hence, the ON voltage of the MOSFET can be decreased.

It should be noted that high resistance layer 302 is insulatively provided above a substrate to connect first and second gate electrodes 96 and 98 to each other. When the MOSFET is turned off, a very small current flows through layer 302, and an electric field inside N−buffer layer 106 is moderated, thus preventing local concentration of an internal electric field. As illustrated on the right portion of FIG. 30, first N+source layer 88 is formed on a side opposite to channel region CH1 to have a three-dimensional pattern. Therefore, electrical contact characteristics of source electrode 92 with respect to first N+source layer 88 can be improved.

According to an embodiment shown in FIGS. 33 to 35, second N+source diffusion layer 90 is integrally formed, and P+type layer 300 serving as a part of a drain diffusion layer has a three-dimensional pattern. More specifically, P+type layer 300 has recess portion 300a whose end portion is located inside N+source diffusion layer 90, and projection portion 300b whose end portion extends to channel region CH2 below second gate electrode 98, as shown in FIG. 34. These rectangular edge portions 300a and 300b are alternately arranged, as clearly illustrated in FIG. 33. With this structure, second channel region CH2 can be divided into sub-channels CH2-1 and CH2-2. Therefore, injection efficiency of holes from the P drain in the ON MOSFET can be improved, and a low ON voltage can be obtained.

Figure 36:
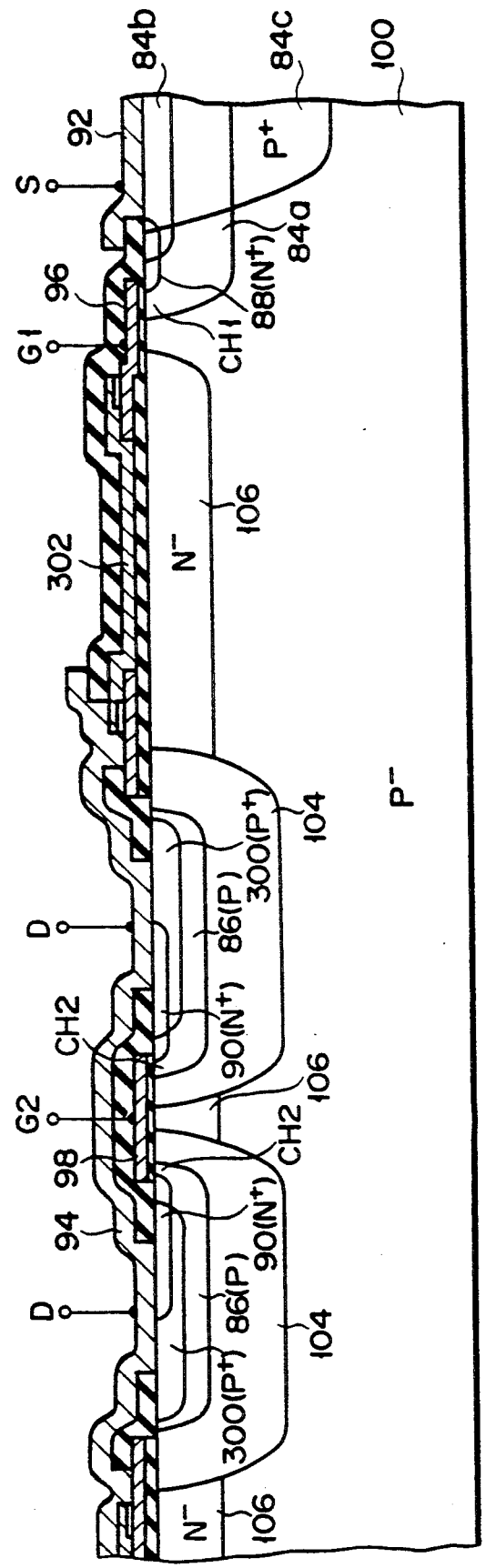
FIG. 36 is a diagram showing a sectional structure of a main part of still another conductivity-modulation MOSFET for embodying the present invention.

According to an embodiment shown in FIG. 36, second N+source diffusion layer 90 is formed on an end portion (of P drain diffusion layer 86) farther from P base diffusion layer 84a in P drain diffusion layer 86. P+layer 300 is formed on an end portion of P drain diffusion layer 86 closer to P base diffusion layer 84a. With this structure, holes can be efficiently injected from P+layer 300 into N drain isolation diffusion layer 104 and N−buffer 106 when the MOSFET is turned on.

Figure 37:
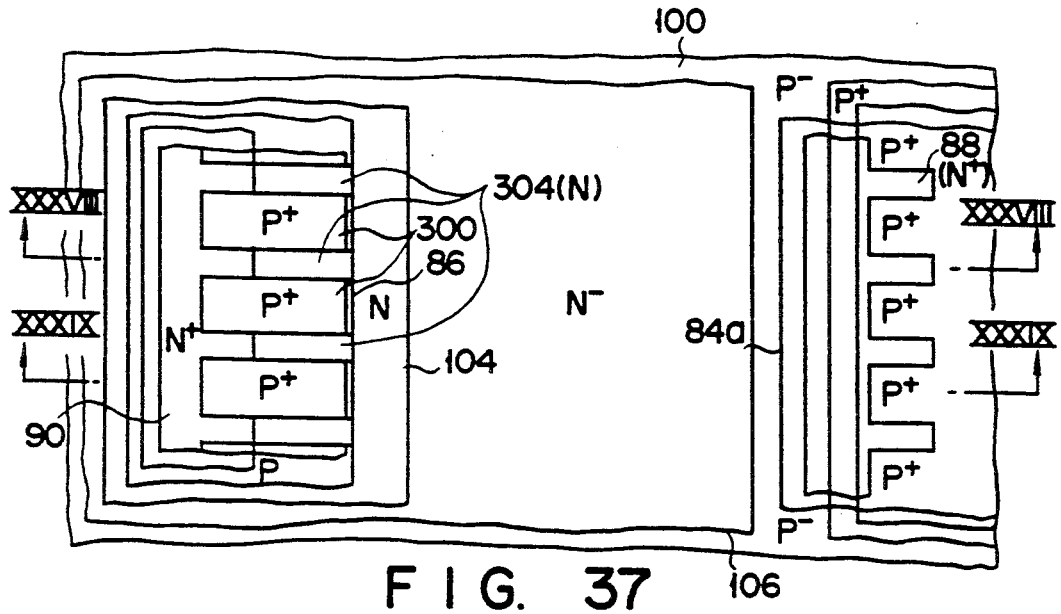
FIG. 37 is a diagram showing a two-dimensional structure of a main part of still another conductivity-modulation MOSFET for embodying the present invention.
Figure 38:
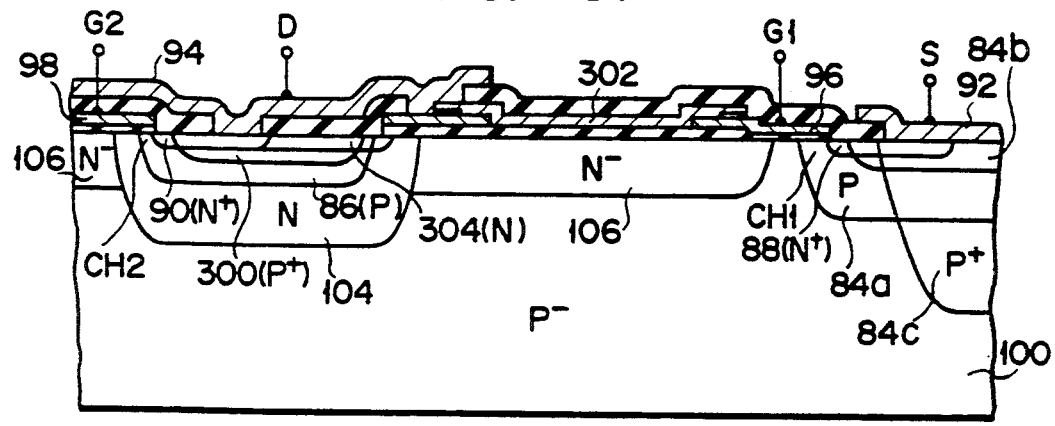
FIGS. 38 and 39 are diagrams showing sectional structures taken along different cutting lines of the device shown in FIG. 37.
Figure 39:
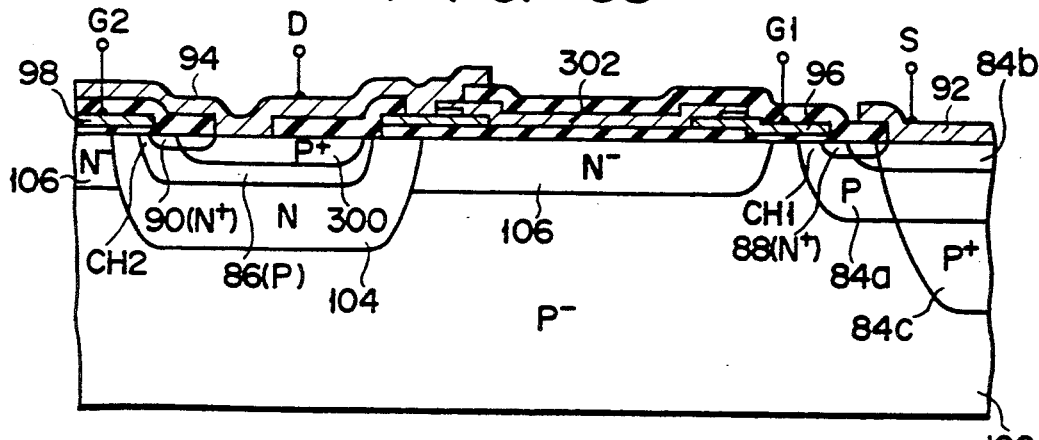

According to an embodiment shown in FIGS. 37 to 39, high-resistance N diffusion layers 304 are formed in N drain isolation layer 104 to partially overlap P+type layers 300. These N type layers 304 are linearly arranged at equal intervals on an a portion opposite to channel region CH2, thus electrically shorting second N+source diffusion layer 90 to N drain isolation layer 104. With this structure, electrons are discharged through channel CH2, and are also discharged through high-resistance N diffusion layers 304 when the MOSFET is turned off. Therefore, the switching speed of the device can be increased. Since P+layers 300 are located on the side opposite to channel CH2 and closer to N−buffer layer 106, injection efficiency of holes from P drain 86 upon turn-on of the MOSFET can be improved, and hence, the turn-on voltage can be decreased.

Figure 40:
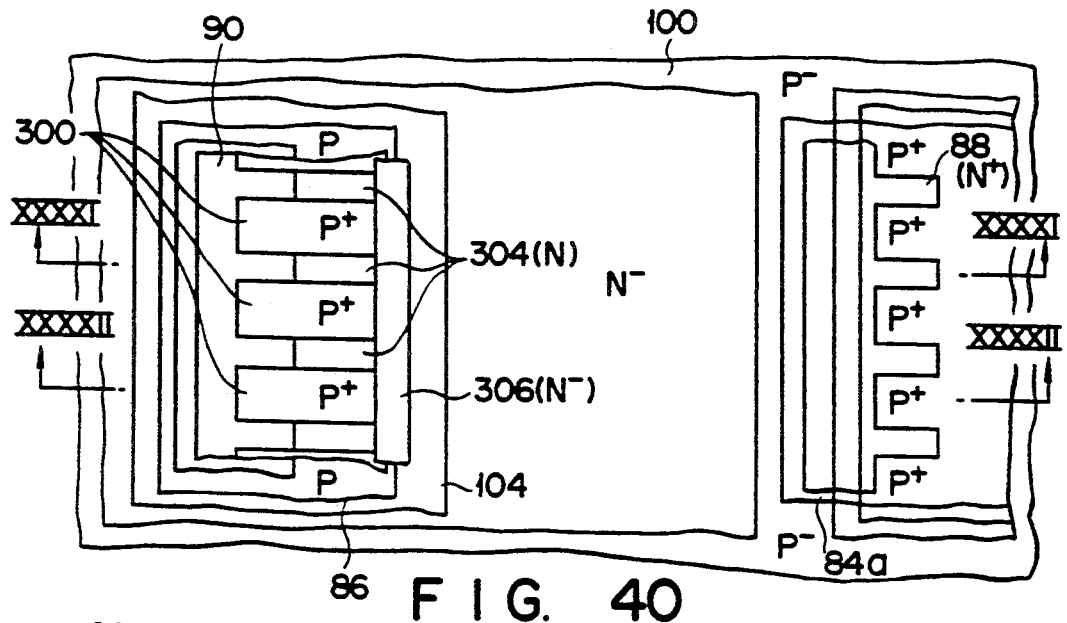
FIG. 40 is a diagram showing a two-dimensional structure of a main part of still another conductivity-modulation MOSFET for embodying the present invention.
Figure 41:
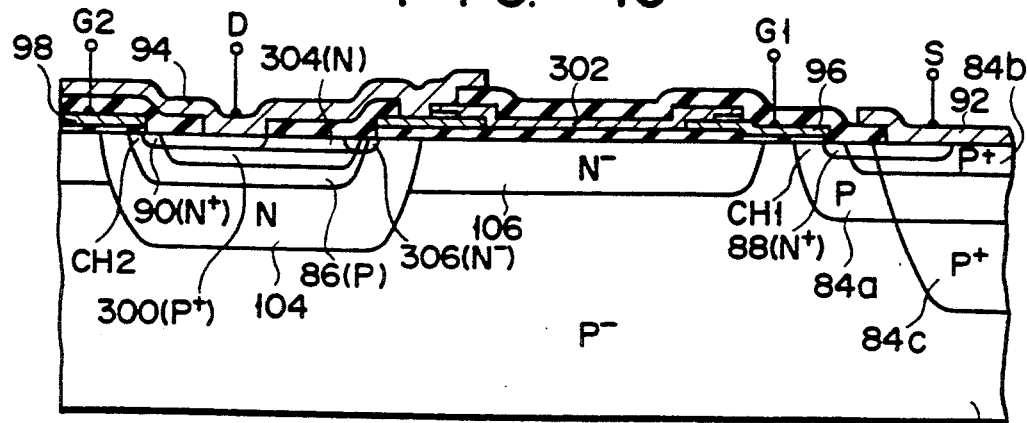
FIGS. 41 and 42 are diagrams showing sectional structures taken along different cutting lines of the device shown in FIG. 40.
Figure 42:
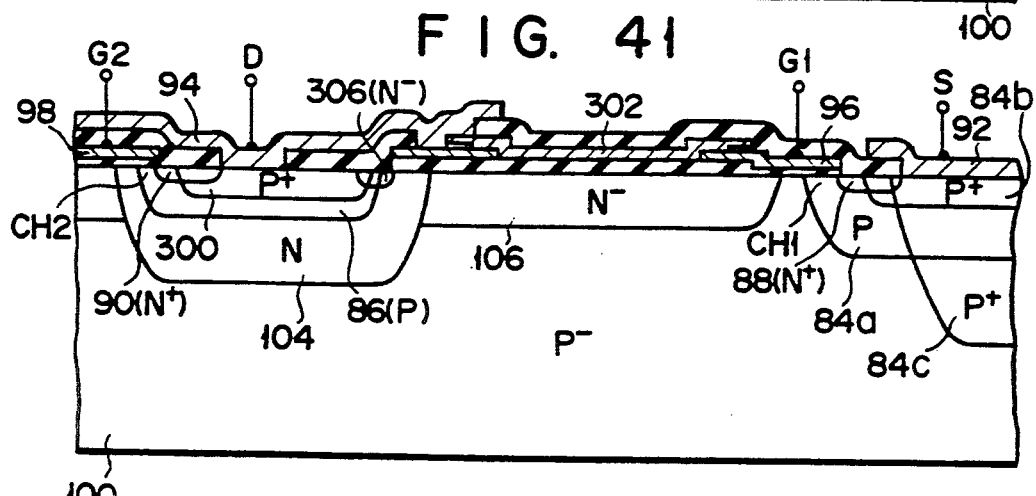

According to an embodiment shown in FIGS. 40 to 42, N+diffusion layer 306 is provided to electrically short together first end portions of high-resistance layers 304. N+diffusion layer 306 is formed in N drain isolation layer 104 and parallel to second N+source diffusion layer 90, as best illustrated in FIG. 40. High-resistance layers 304 for shorting second N+source diffusion layer 90 and N drain isolation layer 104 are connected to each other by N+diffusion layer 306, so that electrons can be uniformly discharged into drain electrode 94 when the MOSFET is turned off. Therefore, the switching speed of the element can be increased. Since N type layers 304 has a high resistance, passing of electrons through N type layers 304 can be suppressed. In this case, most electrons pass through P drain layer 86. Therefore, holes equivalent to passing electrons are injected, thus providing good conductivity-modulation action.

According to an embodiment shown in FIG. 43, short holes 308 are formed in N+layer 90 formed in P drain layer 86. N buffer 104 is partially shorted to N+layer 90 through these short holes 308. The shape of these short holes 308 may be arbitrarily determined.

Electrons accumulated in N base 106 are discharged into drain electrode 94 through short holes 308, and hence, a turn-off time of the device can be shortened. It can be regarded that this structure has a PNPN junction thyristor structure when viewed from the source of the device, and reverse conductive characteristics having a low turn-on voltage can be provided.

FIGS. 44 and 45 show other modifications of the present invention. According to a gate-turn off thyristor shown in FIG. 44, P−type diffusion layers 314 and 316 are formed in a region surrounded by $SiO_2$ layer 312. Shallow N−type diffusion layer (N base) 318 and deep N type diffusion layer (N buffer) 320 are formed in P−layer 316. P type layer 322, P+type layer 324, and N+layer 325 are formed in layer 320, and anode electrode layer 326 are formed on these layers. P type layer 328 is formed in P−layer 316, and N type layer 330, N+type layer 332, and P+type layers 334a and 334b are formed in layer 328. Cathode electrode C is in electrical contact with layers 332 and 334. First and second gate electrodes G1 and G2 are insulatively provided above the wafer. With this structure, when second gate electrode G2 and the anode electrode are shorted and a positive voltage is applied to first gate electrode G1, the thyristor constituted by layers 332, 328, 316, 320, and 324 is turned on. When negative voltages are applied to the both of second gate electrodes G1 and G2, the thyristor is turned off. FIG. 45 shows a case wherein the thyristor structure is applied to a normal double-gate device.

What is claimed is:

1. A semiconductor device comprising:
   (a) a semiconductive substrate;
   (b) a conductivity-modulation insulated-gate transistor formed on said substrate, said transistor having a first base region, a second base region, a source region formed in said second base region, a source electrode region for electrically connecting said second base region and said source region, a drain region, a drain electrode formed on said drain region, and a gate electrode insulatively provided on said substrate; and
   (c) means provided on said substrate and connected to said transistor for, when said transistor is turned off, increasing an electrical connectivity between said first base region and said drain electrode in such a manner as to facilitate carriers stored or accumulated in said first base region to flow into said drain electrode, thereby accelerating removal of the carriers in said transistor, said means decreasing the electrical connectivity between said first base region and said drain electrode when said transistor is turned on, said means comprising a switching transistor for, when said conductivity-modulation transistor is turned off, electrically connecting said first base region to said drain electrode, and for, when said conductivity-modulation transistor is turned on, electrically disconnecting said first base region from said drain electrode;
   wherein said conductivity-modulation transistor includes a first metal oxide semiconductor field effect transistor, and said switching transistor includes a second metal oxide semiconductor field effect transistor;
   wherein said first and second metal oxide semiconductor field effect transistors are respectively formed on first and second surface regions on one surface of said substrate; and
   wherein said second base region and said drain region have the same conductivity type as that of said substrate, and said first base region includes a first semiconductor layer which has a conductivity type different from that of said substrate, said second base region and said drain region and which has a thickness smaller than that of said second base layer and said drain layer.

2. The device according to claim 1, wherein said first base layer comprises:
   a second semiconductor layer formed in said substrate surrounding said drain region, and
   said first semiconductor layer formed in a surface portion of said substrate and connected with said second semiconductor layer and said second base region.

3. The device according to claim 2, wherein said second semiconductor layer is substantially aligned with an end portion of a gate electrode of said second metal oxide semiconductor field effect transistor.

4. The device according to claim 3, wherein said first semiconductor layer comprises a shallow lightly-doped diffusion layer.

5. The device according claim 4, wherein the lightly-doped diffusion layer is not larger than $4 \times 10^{12}/cm^2$ in its impurity concentration.

6. The device according to claim 5 wherein the impurity concentration of said lightly-doped layer is between $5 \times 10^{11}$ to $4 \times 10^{12}/cm^2$.

7. A semiconductor device comprising:
   (a) a semiconductor substrate;
   (b) a conductivity-modulation insulated gate transistor formed on said substrate, said transistor having a first base region, a second base region, a source region formed in said second base region, a source electrode region for electrically conducting said second base region and said source region, a drain region, a drain electrode formed on said drain region, and a gate electrode insulatively provided on said substrate; and
   (c) means provided on said substrate and connected to said transistor for, when said transistor is turned off, increasing an electrical connectivity between said first base region and said drain electrode in such a manner as to facilitate carriers stored or accumulated in said first base region to flow into said drain electrode, thereby accelerating dispersion of the carriers in said transistor, said means decreasing the electrical connectivity between said first base region and said drain electrode when said transistor is turned on, said means comprising a switching transistor for, when said conductivity-modulation transistor is turned off, electrically connecting said first base region to said drain electrode, and for, when said conductivity-modulation transistor is turned on, electrically disconnecting said first base region from said drain electrode;
   wherein said conductivity-modulation transistor includes a first metal oxide semiconductor field effect transistor, and said switching transistor includes a second metal oxide semiconductor field effect transistor; and
   wherein said second metal oxide semiconductor field effect transistor has a channel region including a lightly-doped bypass layer in which an impurity of the same conductivity type as that of said first base region is implanted, whereby said first base region is half-connected to said drain electrode through said bypass layer of said second metal oxide semiconductor field effect transistor.

8. A semiconductor device comprising:
(a) a semiconductive substrate;
(b) a conductivity-modulation insulated-gate transistor formed on said substrate, said transistor having a first base region, a second base region, a source region formed in said second base region, a source electrode region for electrically connecting said second base region and said source region, a drain region, a drain electrode formed on said drain region, and a gate electrode insulatively provided on said substrate; and
(c) means for, when said transistor is turned off, increasing an electrical connectivity between said first base region and said drain electrode in such a manner as to facilitate carriers stored or accumulated in said first base region to flow into said drain electrode, thereby accelerating dispersion of the carriers in said transistor;
wherein said means comprises a lightly-doped bypass layer, formed in said substrate and implanted with an impurity of the same conductivity type as that of said first base region, for constantly half-connecting said first base region to said drain electrode throughout turn-on and turn-off modes of said transistor.

9. A conductivity-modulation metal oxide semiconductor field effect transistor device comprising:
(a) a semiconductor substrate having a surface;
(b) a first semiconductive base layer of a first conductivity type, provided in said substrate;
(c) a first semiconductive diffusion layer of a second conductivity type formed in the surface of said substrate to serve as a second base of said device;
(d) a second semiconductive diffusion layer of the first conductivity type formed in said first diffusion layer and serving as a first source of said device, said second diffusion layer defining a first channel region in said first diffusion layer;
(e) a first gate electrode insulatively provided above the surface of said substrate and covering said first channel region;
(f) a third semiconductive diffusion layer of the second conductivity type formed in the surface of said substrate and serving as a drain of said device;
(g) a fourth semiconductive diffusion layer of the first conductivity type formed in said third diffusion layer and serving as a second source of said device, said fourth diffusion layer defining a second channel region in said third diffusion layer;
(h) a second gate electrode insulatively provided above the surface of said substrate and covering said second channel region, said fourth diffusion layer and second gate electrode constituting a voltage-controlled switching transistor which is rendered conductive when said device is turned off and electrically shorts said first base layer to said fourth diffusion layer, said switching transistor being rendered nonconductive when said device is turned on, so as to disconnect said fourth diffusion layer from said first base layer;
(i) a first layer section surrounding said third diffusion layer in said substrate; and
(j) said first base layer having a second layer section which is formed in a surface section of said substrate so as to connect with said first layer section, and which has an impurity concentration lower than that of said first layer section and a thickness smaller than that of said second base and said drain.

10. The device according to claim 9, wherein said third diffusion layer is formed on the surface of said substrate to have an island shape, whereas said first diffusion layer is formed to two-dimensionally surround said third diffusion layer.

11. The device according to claim 9, wherein said first diffusion layer is formed on the surface of said substrate to have an island shape, whereas said third diffusion layer is formed to two-dimensionally surround said first diffusion layer.

12. The device according to claim 9, wherein said first diffusion layer and said third diffusion layer are formed on the surface of said substrate to have an island shape, respectively.

13. The device according to claim 12, wherein said device further comprises a semiconductive diffusion layer of the first conductivity type, which is formed in the surface of said substrate to two-dimensionally surround said first diffusion layer and said third diffusion layer.

14. The device according to claim 9, wherein said device further comprises a semiconductive diffusion layer of the first conductivity type, which is formed in said third diffusion layer and accelerates injection of a second kind of carriers from said third diffusion layer.

15. The device according to claim 9, wherein said fourth diffusion layer is at least partially formed to be discontinuous, so that said second channel region is divided into first sub channels which substantially contribute to transistor action and second sub channels which do not substantially contribute to transistor action.

16. The device according to claim 15, wherein said first sub channels and said second sub channels are alternately arranged along said second channel region.

17. The device according to claim 16, wherein said device further comprises lightly-doped high-resistance semiconductive diffusion layers of a conductivity type opposite to that of said fourth diffusion layer, which are provided in said first sub channels so as to be in electrical contact with said fourth diffusion layer, said high-resistance layers allowing discharge of carriers into said drain of said device when said device is turned off.

18. The device according to claim 17, wherein said device further comprises a seventh semiconductive diffusion layer of the first conductivity type, which is formed in said substrate along said second channel region, for electrically connecting first end portions of said high-resistance layers.

* * * * *

UNITED STATES PATENT AND TRADEMARK OFFICE
CERTIFICATE OF CORRECTION

PATENT NO. : 5,124,773
DATED : June 23, 1992
INVENTOR(S) : Akio Nakagawa et al.

It is certified that error appears in the above-identified patent and that said Letters Patent is hereby corrected as shown below:

Title page, item (30):
The Foreign Application Priority Data has been omitted, [30], should be, --Feb. 26, 1987 [JP] Japan......................62-41309

May 8, 1987 [JP] Japan........................62-110743

Dec. 3, 1987 [JP] Japan........................62-304634--.

Signed and Sealed this

Seventeenth Day of August, 1993

Attest:

BRUCE LEHMAN

*Attesting Officer*        *Commissioner of Patents and Trademarks*